United States Patent
Yazaki

(10) Patent No.: US 9,281,797 B2
(45) Date of Patent: Mar. 8, 2016

(54) HIGH-FREQUENCY DEVICE AND DIRECTIONAL COUPLER

(71) Applicant: Murata Manufacturing Co., Ltd., Kyoto (JP)

(72) Inventor: Hirokazu Yazaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/619,497

(22) Filed: Feb. 11, 2015

(65) Prior Publication Data

US 2015/0155848 A1    Jun. 4, 2015

Related U.S. Application Data

(63) Continuation of application No. PCT/JP2013/069522, filed on Jul. 18, 2013.

(30) Foreign Application Priority Data

Aug. 24, 2012    (JP) .................................. 2012-185636

(51) Int. Cl.
*H01P 5/18*    (2006.01)
*H01P 1/23*    (2006.01)
(Continued)

(52) U.S. Cl.
CPC .................. *H03H 7/38* (2013.01); *H01P 1/201* (2013.01); *H01P 1/20345* (2013.01); *H01P 1/22* (2013.01); *H03H 7/06* (2013.01); *H03H 7/24* (2013.01); *H03H 2001/0085* (2013.01)

(58) Field of Classification Search
CPC .............. H01P 5/184; H01P 5/18; H01P 1/23
USPC .......................... 333/109, 116, 12, 167, 81 R
See application file for complete search history.

(56) References Cited

U.S. PATENT DOCUMENTS 4,320,364 A * 3/1982 Sakamoto et al. ............ 333/167
4,746,557 A * 5/1988 Sakamoto et al. ............ 428/138
(Continued)

FOREIGN PATENT DOCUMENTS

JP    52-92401         8/1977
JP    62-189712 A      8/1987
(Continued)

OTHER PUBLICATIONS

International Search Report issued in Application No. PCT/JP2013/069522 dated Oct. 22, 2013.
(Continued)

*Primary Examiner* — Dean Takaoka
(74) *Attorney, Agent, or Firm* — Pearne & Gordon LLP

(57) ABSTRACT

A high-frequency device includes a substrate including a plurality of layers that are stacked on top of one another and that include dielectric and magnetic layers, terminals, pattern conductors each formed on one layer, and via conductors each extending through one layer. The pattern conductors and via conductors connect the terminals and form a signal line that transmits a high-frequency signal. A first portion of the signal line includes a via conductor extending through one magnetic layer and/or a pattern conductor sandwiched between two magnetic layers and has a predetermined resistance to the high-frequency signal. A second portion of the signal line includes a capacitor formed of two pattern electrodes with at least one dielectric layer and no magnetic layers sandwiched there between and/or an inductor including a pattern conductor formed on a dielectric layer. The high-frequency device has an impedance to the high-frequency signal at the terminals.

12 Claims, 19 Drawing Sheets

(51) Int. Cl.
*H03H 7/24* (2006.01)
*H03H 7/38* (2006.01)
*H01P 1/201* (2006.01)
*H01P 1/22* (2006.01)
*H01P 1/203* (2006.01)
*H03H 7/06* (2006.01)
*H03H 1/00* (2006.01)

(56) References Cited

U.S. PATENT DOCUMENTS

| | | | | |
|---|---|---|---|---|
| 4,904,967 | A * | 2/1990 | Morii et al. | 333/185 |
| 6,853,268 | B2 * | 2/2005 | Harada | 333/185 |
| 7,961,064 | B2 * | 6/2011 | Kearns et al. | 333/109 |

FOREIGN PATENT DOCUMENTS

| | | |
|---|---|---|
| JP | 63-098206 A | 4/1988 |
| JP | 01-110708 A | 4/1989 |
| JP | 03-015363 A | 1/1991 |
| JP | 07-192927 A | 7/1995 |
| JP | 08-078218 A | 3/1996 |
| JP | 2006-191355 A | 7/2006 |
| JP | 2009-044303 A | 2/2009 |
| JP | 2011-055457 A | 3/2011 |

OTHER PUBLICATIONS

Written Opinion issued in Application No. PCT/JP2013/069522 dated Oct. 22, 2013.

* cited by examiner

TO FIG. 26

HIGH-FREQUENCY DEVICE AND DIRECTIONAL COUPLER

BACKGROUND OF THE INVENTION

1. Field of the Invention

The present invention relates to a high-frequency device that includes a high-frequency circuit including an attenuator and that is formed as a single chip. The present invention also relates to a directional coupler that includes a high-frequency circuit including an attenuator and that is formed as a single chip.

2. Description of the Related Art

Known examples of a high-frequency device or high-frequency circuit related to transmission of high-frequency signals include, for example, the inventions disclosed in Patent Documents 1 to 6.

Patent Document 1 discloses a method of manufacturing a T-type attenuator including a conductor extending through a hole in a ferrite core.

Patent Document 2 discloses a signal transmission device that has high-band blocking and low-band transmission characteristics in which high-frequency components in a high-frequency band are absorbed.

Patent Document 3 discloses a high-frequency noise filter in which an LC circuit is formed as a result of a chip capacitor being connected to an outer magnetic plate of a multilayer inductor that is formed by stacking magnetic plates, having at least insulating surfaces and conductor portions formed on the surfaces, and by respectively connecting the conductor portions in series with one another.

Patent Document 4 discloses an attenuator including an inductor inserted in one line of a transmission path formed of a pair of lines and a pair of series circuits each formed of a resistor and a capacitor first ends of which are connected to the other line and second ends of which are respectively connected to the two ends of the inductor, where the inductor is formed by making a conductor line extend through a tube made of a magnetic body. The attenuator disclosed in Patent Document 4 is formed of discrete circuit devices including an inductor, resistors, and capacitors.

Patent Document 5 discloses a ferrite sintered body, a chip inductor, and an LC composite component.

Patent document 6 discloses a general directional coupler.

Patent Document 1: Japanese Examined Patent Application Publication No. 3-015363
Patent Document 2: Japanese Unexamined Patent Application Publication No. 8-078218
Patent Document 3: Japanese Unexamined Patent Application Publication No. 62-189712
Patent Document 4: Japanese Unexamined Patent Application Publication No. 63-098206
Patent Document 5: Japanese Unexamined Patent Application Publication No. 1-110708
Patent Document 6: Japanese Unexamined Patent Application Publication No. 2011-055457

BRIEF SUMMARY OF THE INVENTION

When an attenuator is used in a high-frequency circuit, an impedance matching circuit is required to suppress undesired reflection. In the case where the attenuator and the impedance circuit are formed of discrete circuit devices, variations in the characteristics of the circuit devices need to be dealt with to obtain desired attenuation and impedance. In addition, it takes time to form a circuit using discrete circuit devices. Hence, it is desirable to provide an attenuator and an impedance matching circuit in a single chip to simplify the manufacture of an apparatus which uses an attenuator. Further, it is also desirable to provide an attenuator and an impedance matching circuit in a single chip to respond to the request for reduction in the size of an apparatus including a high-frequency circuit, such as a cellular phone.

It is an object of the present invention to provide a high-frequency device that solves the above problems that includes a high-frequency circuit including an attenuator, and that is formed as a single chip. Another object of the present invention is to provide a directional coupler that includes a high-frequency circuit including an attenuator and that is formed as a single chip.

A high-frequency device according to a first aspect of the present invention includes:

a substrate including a plurality of layers that are stacked on top of one another and include at least one dielectric layer and at least one magnetic layer;

first and second terminals;

at least one pattern conductor formed on one of the plurality of layers;

at least one via conductor extending through one of the plurality of layers;

wherein the at least one pattern conductor and the at least one via conductor connect the first and second terminals to each other and form a signal line that transmits a predetermined high-frequency signal, wherein a first portion of the signal line includes at least one of a via conductor extending through one magnetic layer and a pattern conductor sandwiched between two magnetic layers, and the first portion has a predetermined resistance to the high-frequency signal, wherein a second portion of the signal line includes at least one of a capacitor formed of two pattern electrodes in such a manner that at least one dielectric layer is sandwiched therebetween and no magnetic layers are sandwiched therebetween, and an inductor including a pattern conductor formed on at least one dielectric layer, and the high-frequency device has predetermined impedances to the high-frequency signal at the first and second terminals.

The high-frequency device further includes a ground terminal, wherein the signal line includes a first signal line connecting the first and second terminals to each other and a second signal line connecting a connection node on the first signal line and the ground terminal to each other, and wherein the second signal line includes a capacitor formed of two pattern conductors in such a manner that at least one dielectric layer is sandwiched therebetween and no magnetic layers are sandwiched therebetween.

In the high-frequency device, the second signal line includes a via conductor extending through one magnetic layer.

The high-frequency device further includes a ground terminal, wherein the signal line includes a first signal line connecting the first and second terminals to each other, a second signal line connecting a first connection node on the first signal line and the ground terminal to each other, and a third signal line connecting a second connection node on the first signal line and the ground terminal to each other, wherein the first signal line includes, between the first and second connection nodes, an inductor including a pattern conductor formed on at least one dielectric layer, wherein the second signal line includes a first capacitor formed of two pattern conductors in such a manner that at least one dielectric layer is sandwiched therebetween and no magnetic layers are sandwiched therebetween, and includes a first via conductor extending through one magnetic layer, and wherein the third signal line includes a second capacitor formed of two pattern conductors in such a manner that at least one dielectric layer is sandwiched therebetween and no magnetic layers are sandwiched therebetween, and includes a second via conductor extending through one magnetic layer.

The high-frequency device further includes a ground terminal, wherein the signal line includes a first signal line connecting the first and second terminals to each other and a second signal line connecting a connection node on the first signal line and the ground terminal to each other, wherein the first signal line includes, between the first terminal and the connection node connected to the second signal line, a first capacitor formed of two pattern conductors in such a manner that at least one dielectric layer is sandwiched therebetween and no magnetic layers are sandwiched therebetween, and a first pattern conductor sandwiched between two magnetic layers and connected in parallel with the first capacitor, wherein the first signal line includes, between the second terminal and the connection node connected to the second signal line, a second capacitor formed of two pattern conductors in such a manner that at least one dielectric layer is sandwiched therebetween and no magnetic layers are sandwiched therebetween, and includes a second pattern conductor sandwiched between two magnetic layers and connected in parallel with the second capacitor, and wherein the second signal line includes an inductor including a pattern conductor formed on at least one dielectric layer.

The high-frequency device further includes a ground terminal, wherein the signal line includes a first signal line connecting the first and second terminals to each other and a second signal line connecting a connection node on the first signal line and the ground terminal to each other, wherein the first signal line includes, between the first terminal and the connection node connected to the second signal line, a first capacitor formed of two pattern electrodes in such a manner that at least one dielectric layer is sandwiched therebetween and no magnetic layers are sandwiched therebetween, and a first via conductor extending through one magnetic layer, wherein the first signal line includes, between the second terminal and the connection node connected to the second signal line, a second capacitor formed of two pattern conductors in such a manner that at least one dielectric layer is sandwiched therebetween and no magnetic layers are sandwiched therebetween, and a second via conductor extending through one magnetic layer, wherein the second signal line includes a third signal line including at least one of a via conductor extending through one magnetic layer and a pattern conductor sandwiched between two magnetic layers, and includes an inductor including a pattern conductor formed on at least one dielectric layer and connected in parallel with the third signal line.

The high-frequency device further includes a ground terminal, wherein the signal line includes a first signal line connecting the first and second terminals to each other, a second signal line connecting a first connection node on the first signal line and the ground terminal to each other, and a third signal line connecting a second connection node on the first signal line and the ground terminal to each other, wherein the first signal line includes, between the first and second connection nodes, at least one of a via conductor extending through one magnetic layer and a pattern conductor sandwiched between two magnetic layers, wherein the second signal line includes at least one of a via conductor extending through one magnetic layer and a pattern conductor sandwiched between two magnetic layers, and wherein the third signal line includes a fourth signal line including at least one of a via conductor extending through one magnetic layer and a pattern conductor sandwiched between two magnetic layers, and includes a capacitor formed in such a manner that at least one dielectric layer is sandwiched therebetween and no magnetic layers are sandwiched therebetween and connected in parallel with the fourth signal line.

The high-frequency device is an attenuator.
The high-frequency device is a low pass filter.
The high-frequency device is a high pass filter.
The high-frequency device is a band pass filter.

A directional coupler according to a second aspect of the present invention includes:

first to fourth ports;

a first transmission line provided between the first and second ports;

a second transmission line provided between the third and fourth ports and electromagnetically coupled to the first transmission line;

a first attenuator provided between the third port and the second transmission line; and a second attenuator provided between the fourth port and the second transmission line, wherein the first and second attenuators are the high-frequency devices according to the first aspect of the present invention.

According to the present invention, an attenuator and an impedance matching circuit can be provided in a single chip, and further, the attenuation and impedance can be adjusted in accordance with requirements. According to the high-frequency device of the present invention, a high-frequency circuit that suppresses undesired reflection while attenuating a high-frequency signal with desired attenuation can be provided in a single chip. Further, as a result of an attenuator and an impedance matching circuit being provided in a single chip, variations in attenuation and variations in impedance can be reduced, and a high-frequency circuit can be reduced in size.

DETAILED DESCRIPTION OF THE INVENTION

First Embodiment

Figure 1:
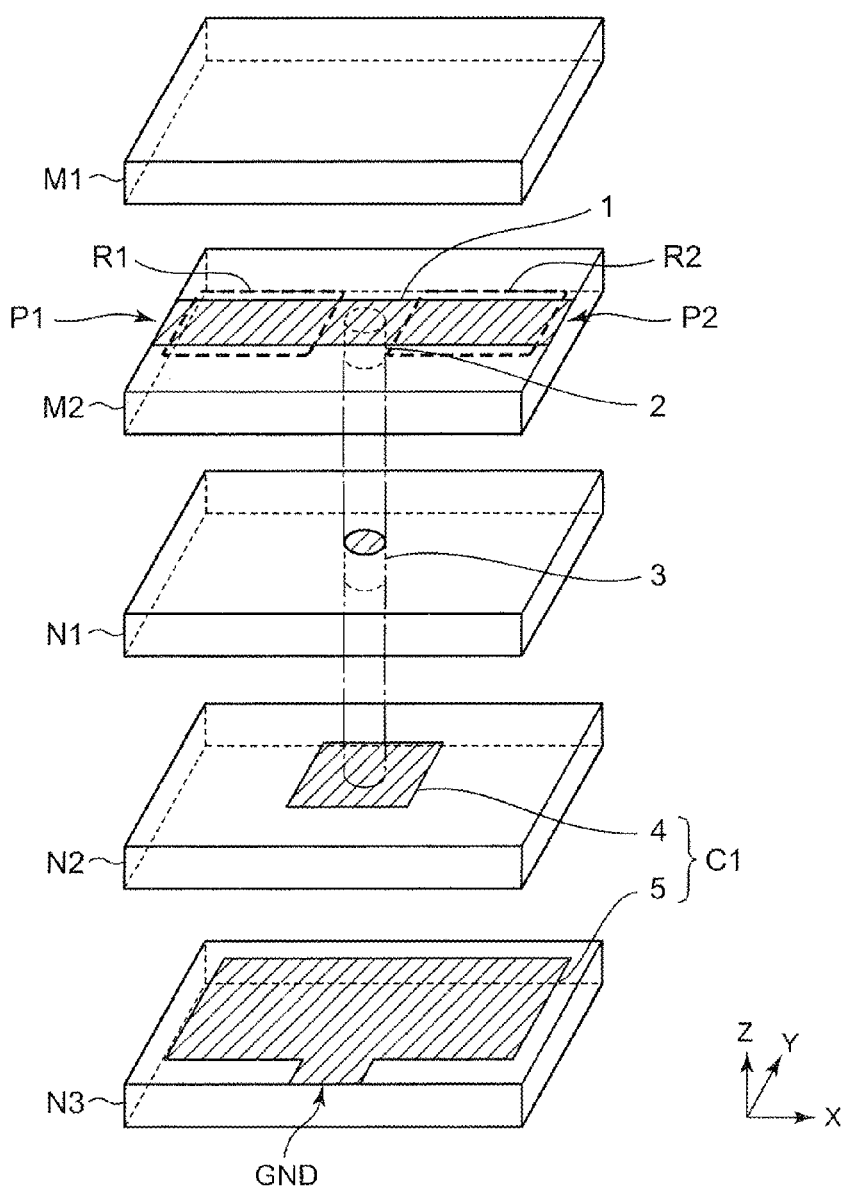
FIG. 1 is an exploded perspective view of the configuration of a high-frequency device according to a first embodiment of the present invention.
Figure 2:
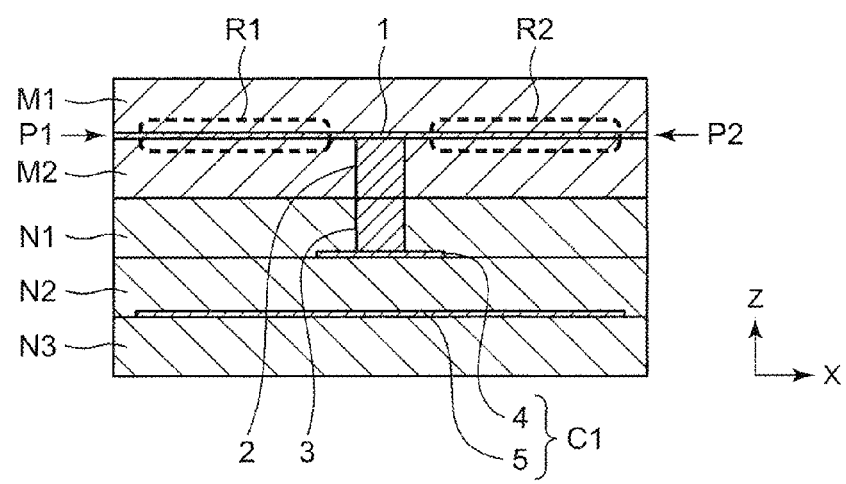
FIG. 2 is a cross-sectional view of the high-frequency device illustrated in FIG. 1 in a multilayer stacked state.

FIG. 1 is an exploded perspective view of the configuration of a high-frequency device according to a first embodiment of the present invention. FIG. 2 is a cross-sectional view of the high-frequency device illustrated in FIG. 1 in a multilayer stacked state. The cross-sectional view in FIG. 2 illustrates a cross section along a plane parallel to the XZ plane passing through the center of the high-frequency device in the Y-direction.

The high-frequency device illustrated in FIG. 1 is provided with a substrate including a plurality of layers stacked on top of one another, including at least one of dielectric layers N1 to N3 and at least one of magnetic layers M1 and M2. The high-frequency device includes at least one of pattern conductors 1, 4, and 5 each formed on one of the plurality of layers, and at least one of via conductors 2 and 3 each extending through one of the plurality of layers. A one-dot chain line between the magnetic layer M2 and the dielectric layer N1 and a one-dot chain line between the dielectric layers N1 and N2 indicate electrical connections made at the time when the dielectric layers N1-N3 and the magnetic layers M1 and M2 are stacked on top of one another (the same is applicable in the other figures). The high-frequency device further includes terminals P1 and P2 for input/output of a high-frequency signal formed at the pattern conductor 1 and includes a ground terminal GND formed at the pattern conductor 5. The pattern conductors 1, 4, and 5 and the via conductors 2 and 3 connect the terminals P1 and P2 and the ground terminal GND to one another, thereby forming a signal line for transmitting a high-frequency signal.

A portion of the signal line includes at least one of a via conductor extending through one magnetic layer and a pattern conductor sandwiched between two magnetic layers. When a high-frequency signal flows through such a portion of the signal line, part of the high-frequency signal is converted into heat by the magnetic body surrounding the signal line, whereby the high-frequency signal is attenuated. Hence, this portion of the signal line has a predetermined resistance to the high-frequency signal. In the high-frequency device illustrated in FIG. 1, portions of the pattern conductor 1 sandwiched between the two magnetic layers M1 and M2 are shown as resistors R1 and R2. Note that, although illustration is omitted for the sake of simplicity, the via conductor 2 extending through the magnetic layer M2 may also function as a resistor.

Another portion of the signal line includes at least one of a capacitor formed of two pattern conductors in such a manner that at least one dielectric layer is sandwiched therebetween and no magnetic layers are sandwiched therebetween and an inductor including a pattern conductor formed on at least one dielectric layer. Either or both of the capacitor and inductor included in the signal line are configured in such a manner that the high-frequency device has a predetermined impedance to a high-frequency signal at the terminals P1 and P2. In the high-frequency device illustrated in FIG. 1, the signal line includes a first signal line connecting the terminals P1 and P2 to each other and a second signal line that connects a connection node on the first signal line to the ground terminal GND, and the second signal line includes a capacitor C1 that is formed of the pattern conductors 4 and 5 in such a manner that the dielectric layer N2 is sandwiched therebetween and no magnetic layers are sandwiched therebetween.

Figure 3:
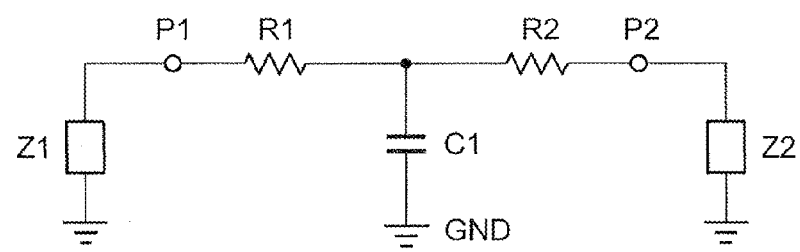
FIG. 3 is an equivalent circuit diagram of the high-frequency device illustrated in FIG. 1.

FIG. 3 is an equivalent circuit diagram of the high-frequency device illustrated in FIG. 1. The high-frequency device functions as an attenuator as a result of a portion of the signal line having the resistances R1 and R2 to the high-frequency signal. When load impedances Z1 and Z2 are respectively connected to the terminals P1 and P2, undesired reflection can be suppressed, as a result of the portion of the signal line including at least one (capacitor C1 in FIG. 1) of the capacitor and inductor and thereby realizing impedance matching at the terminals P1 and P2.

The dielectric layers N1 to N3 and the magnetic layers M1 and M2 are formed of an insulating ceramic. The magnetic layers M1 and M2 are formed of, for example, a magnetic material having a relative permeability of 100-300, and, for example, ferrite can be used. The dielectric layers N1 to N3 are nonmagnetic bodies (having a relative permeability of 1) that cause substantially no attenuation when a high-frequency signal flows through a via conductor extending through the dielectric layer or flows through a pattern conductor formed between two neighboring dielectric layers.

The dimensions and relative permeability of the dielectric layers N1 to N3, the dimensions and relative permeability of the magnetic layers M1 and M2, and the dimensions of the pattern conductors 1, 4, and 5 and the via conductors 2 and 3 are designed in such a manner as to realize desired attenuation and impedance.

The whole high-frequency device is produced using, for example, a low-temperature co-fired ceramic (LTCC) manufacturing process.

Figure 4:
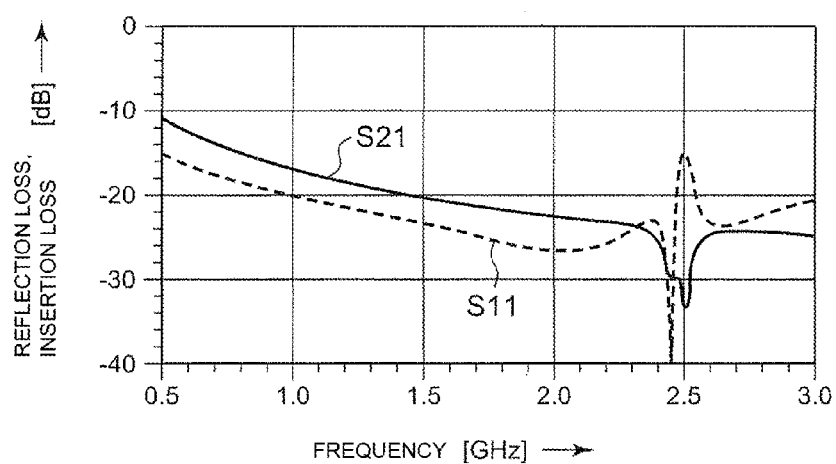
FIG. 4 is a graph illustrating the frequency characteristics of a reflection loss (S11) and an insertion loss (S21) according to the high-frequency device illustrated in FIG. 1.

FIG. 4 is a graph illustrating the frequency characteristics of a reflection loss (S11) and an insertion loss (S21) according to the high-frequency device illustrated in FIG. 1. The graph of FIG. 4 illustrates the measurement results regarding a prototype high-frequency device. According to FIG. 4, it can be seen that the high-frequency device illustrated in FIG. 1 actually functions as an attenuator.

According to the high-frequency device illustrated in FIG. 1, an attenuator and an impedance matching circuit can be provided in a single chip, and further, the attenuation and impedance can be adjusted in accordance with requirements. According to the high-frequency device illustrated in FIG. 1, a high-frequency circuit that allows undesired reflection to be suppressed while attenuating a high-frequency signal by a desired amount can be provided in a single chip. In addition, by proving an attenuator and an impedance matching circuit in a single chip, variations in attenuation and variations in impedance can be reduced, and the size of a high-frequency circuit can be reduced.

Second Embodiment

Figure 5:
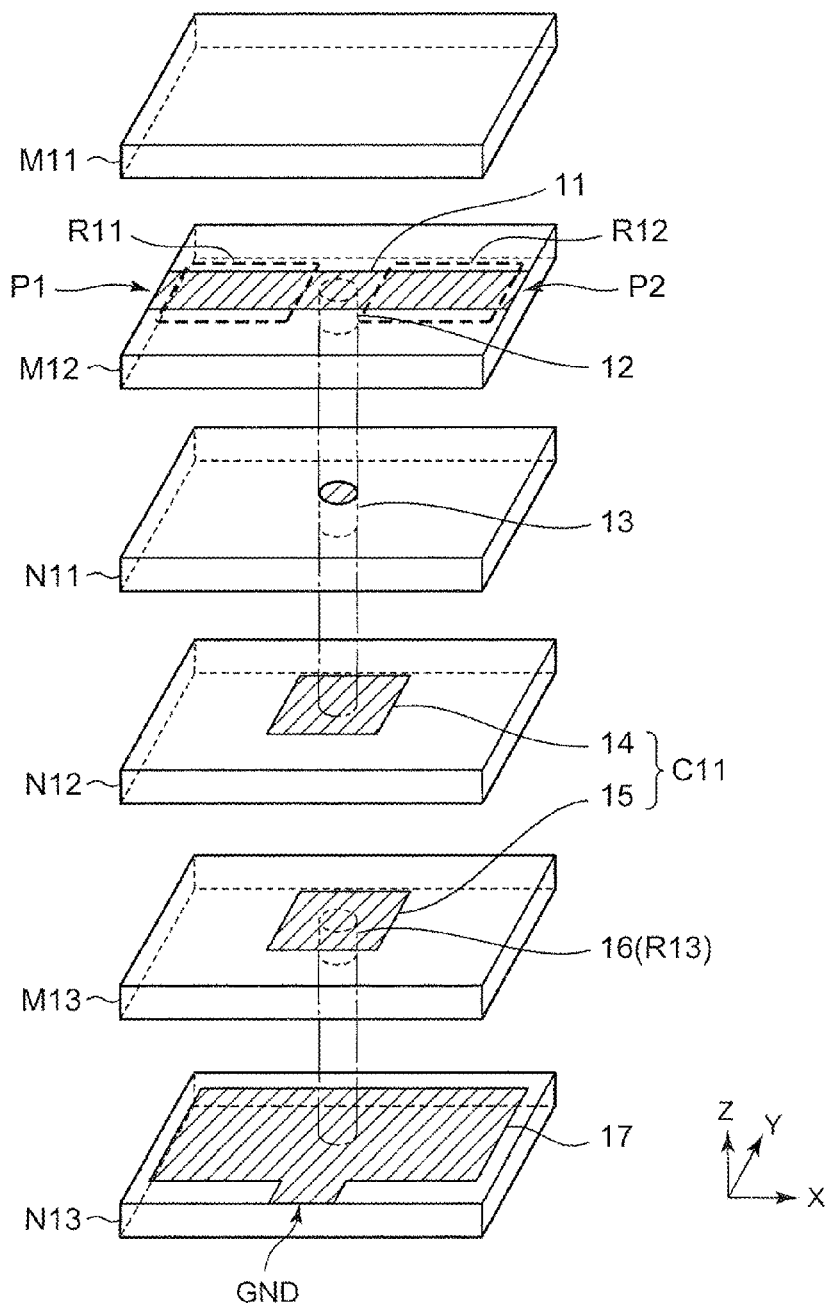
FIG. 5 is an exploded perspective view of the configuration of a high-frequency device according to a second embodiment of the present invention.
Figure 6:
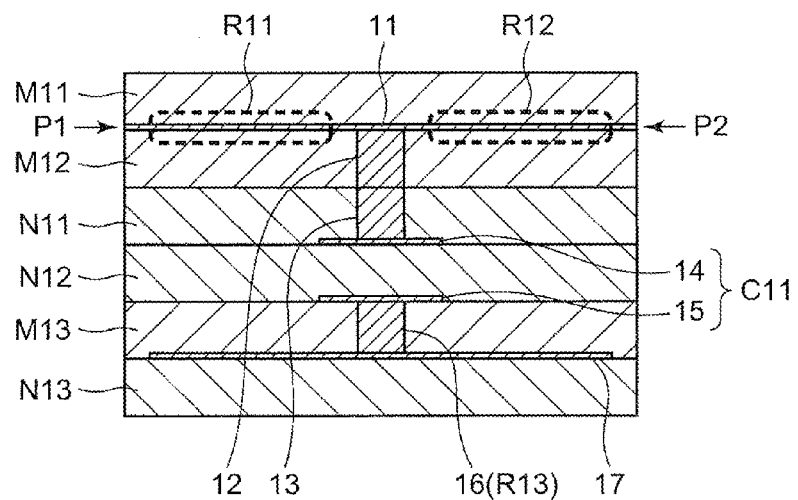
FIG. 6 is a cross-sectional view of the high-frequency device illustrated in FIG. 5 in a multilayer stacked state.

FIG. 5 is an exploded perspective view of the configuration of a high-frequency device according to a second embodiment of the present invention. FIG. 6 is a cross-sectional view of the high-frequency device illustrated in FIG. 5 in a multilayer stacked state.

The high-frequency device illustrated in FIG. 5 includes a substrate that includes a plurality of layers stacked on top of one another including dielectric layers N11 to N13 and magnetic layers M11 to M13. The high-frequency device includes pattern conductors 11, 14, 15, and 17 each formed on one of the plurality of layers and via conductors 12, 13, and 16 each extending through one of the plurality of layers. The high-frequency device further includes terminals P1 and P2 formed at the pattern conductor 11, and includes a ground terminal GND formed at the pattern conductor 17. The pattern conductors 11, 14, 15, and 17 and the via conductors 12, 13, and 16 connect the terminals P1 and P2 and the ground terminal GND to one another, thereby forming a signal line for transmitting a high-frequency signal.

Respective portions of the signal line include the pattern conductor 11 sandwiched between the two magnetic layers M11 and M12 and the via conductor 16 extending through the magnetic layer M13. These portions of the signal line respectively have predetermined resistances R11 and R12, and a resistance R13 to a high-frequency signal.

Another portion of the signal line includes at least one of a capacitor formed of two pattern conductors in such a manner that at least one dielectric layer is sandwiched therebetween and no magnetic layers are sandwiched therebetween and an inductor including a pattern conductor formed on at least one dielectric layer. In the high-frequency device illustrated in FIG. 5, the signal line includes a first signal line connecting the terminals P1 and P2 to each other and a second signal line that connects a connection node on the first signal line to the ground terminal GND, and the second signal line includes a capacitor C11 that is formed of the pattern conductors 14 and 15 in such a manner that the dielectric layer N12 is sandwiched therebetween and no magnetic layers are sandwiched therebetween.

Figure 7:
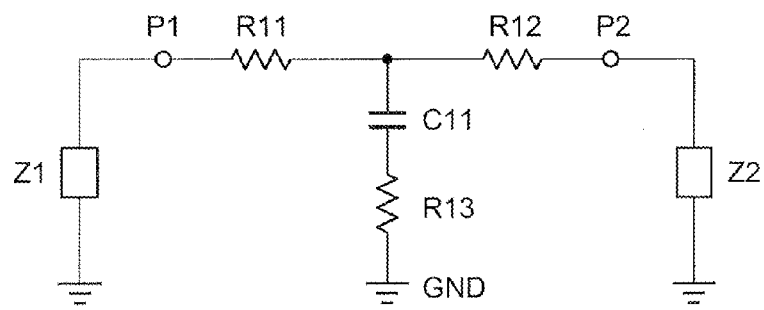
FIG. 7 is an equivalent circuit diagram of the high-frequency device illustrated in FIG. 5.

FIG. 7 is an equivalent circuit diagram of the high-frequency device illustrated in FIG. 5. This is the same as the equivalent circuit diagram illustrated in FIG. 3 except that the resistor R13 has been added. The capacitor C11 adjusts the impedance and, at the same time, has a function of letting a high-frequency signal flowing through the first signal line go to the ground terminal GND. By adding the resistor R13 to the second signal line, a portion of a high-frequency current flowing to the ground terminal GND is adjusted, thereby allowing the attenuation between the terminals P1 and P2 to be adjusted.

Figure 8:
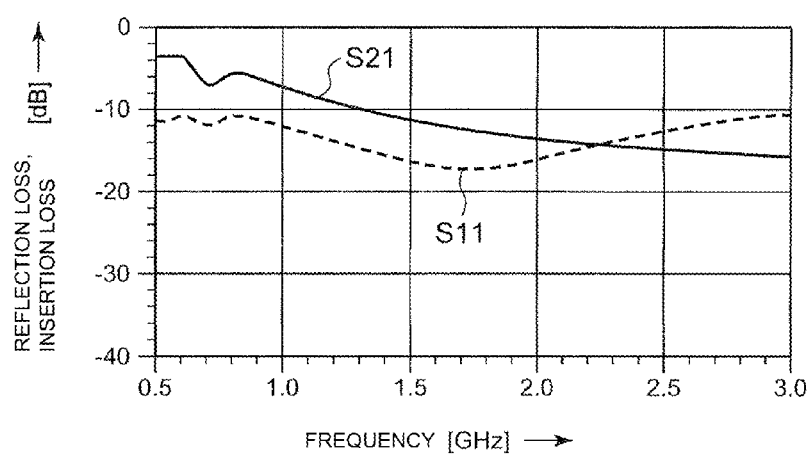
FIG. 8 is a graph illustrating the frequency characteristics of a reflection loss (S11) and an insertion loss (S21) according to the high-frequency device illustrated in FIG. 5.

FIG. 8 is a graph illustrating the frequency characteristics of a reflection loss (S11) and an insertion loss (S21) according to the high-frequency device illustrated in FIG. 5. The graph of FIG. 8 illustrates the measurement results regarding a prototype high-frequency device. According to FIG. 8, it can be seen that the high-frequency device illustrated in FIG. 5 actually functions as an attenuator.

As described in the first and second embodiments, a portion of the signal line includes at least one of a via conductor extending through a magnetic layer and a pattern conductor sandwiched between two magnetic layers, and this portion of the signal line has a predetermined resistance to a high-frequency signal. As a result, the high-frequency device can function as an attenuator.

Third Embodiment

Figure 9:
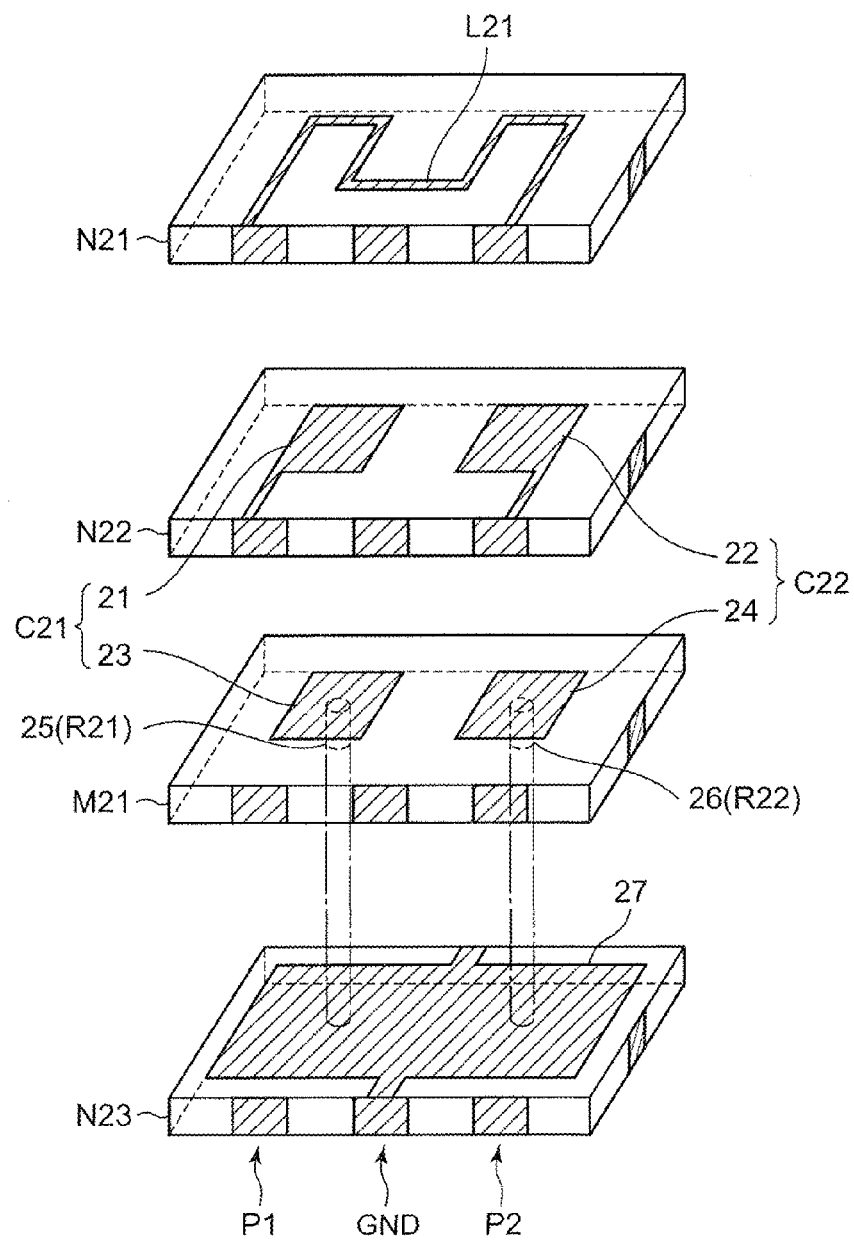
FIG. 9 is an exploded perspective view of the configuration of a high-frequency device according to a third embodiment of the present invention.

FIG. 9 is an exploded perspective view of the configuration of a high-frequency device according to a third embodiment of the present invention.

The high-frequency device illustrated in FIG. 9 includes a substrate that includes a plurality of layers stacked on top of one another including dielectric layers N21 to N23 and a magnetic layer M21. The high-frequency device includes pattern conductors 21 to 24 and 27 each formed on one of the plurality of layers, via conductors 25 and 26 each extending through one of the plurality of layers, and an inductor L21 including a pattern conductor formed on the at least one dielectric layer N21. The high-frequency device further includes terminals P1 and P2 and a ground terminal GND formed on each of the dielectric layers N21 to N23 and the magnetic layer M21. When the dielectric layers N21 to N23 and the magnetic layer M21 are stacked on top of one another, the terminals P1 and P2 and the ground terminal GND formed on one layer are respectively electrically connected to those on another layer. The pattern conductors 21 to 24 and 27, the via conductors 25 and 26, and the inductor L21 connect the terminals P1 and P2 and the ground terminal GND to one another, thereby forming a signal line for transmitting a high-frequency signal.

The signal line includes a first signal line connecting the terminals P1 and P2 to each other, a second signal line connecting a first connection node on the first signal line and the ground terminal GND to each other, and a third signal line connecting a second connection node on the first signal line and the ground terminal GND to each other. The first signal line includes the inductor L21 that includes a pattern conductor formed on the at least one dielectric layer N21, between the first and second connection nodes. The second signal line includes a capacitor C21 formed of the pattern conductors 21 and 23 in such a manner that the at least one dielectric layer N22 is sandwiched therebetween and no magnetic layers are sandwiched therebetween and the via conductor 25 that extends through the single magnetic layer M21. The via conductor 25 that extends through the single magnetic layer M21 has a predetermined resistance R21 to a high-frequency signal. The third signal line includes a capacitor C22 formed of the pattern conductors 22 and 24 in such a manner that the at least one dielectric layer N22 is sandwiched therebetween and no magnetic layers are sandwiched therebetween and the via conductor 26 that extends through the single magnetic layer M21. The via conductor 26 that extends through the single magnetic layer M21 has a predetermined resistance R22 to a high-frequency signal.

Figure 10:
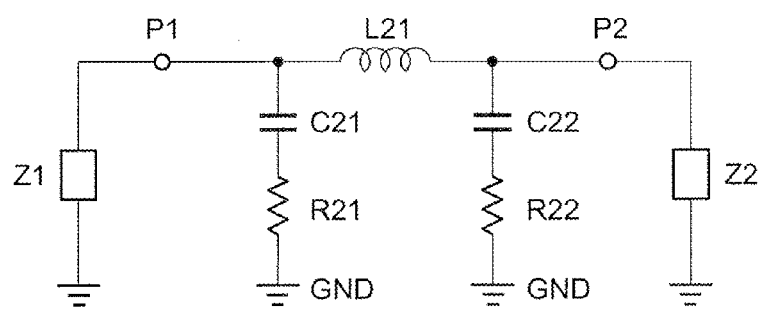
FIG. 10 is an equivalent circuit diagram of the high-frequency device illustrated in FIG. 9.

FIG. 10 is an equivalent circuit diagram of the high-frequency device illustrated in FIG. 9. The high-frequency device illustrated in FIG. 9 functions as an attenuator and, at the same time, functions as a π-type low pass filter.

Figure 11:
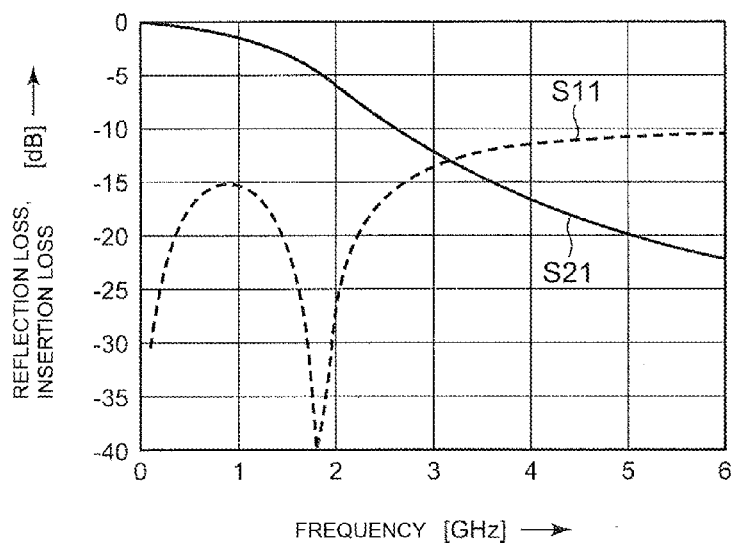
FIG. 11 is a graph illustrating the frequency characteristics of a reflection loss (S11) and an insertion loss (S21) according to the high-frequency device illustrated in FIG. 9.

FIG. 11 is a graph illustrating the frequency characteristics of a reflection loss (S11) and an insertion loss (S21) according to the high-frequency device illustrated in FIG. 9. The graph of FIG. 11 illustrates simulation results regarding a high-frequency device having the following parameter values. The inductance of the inductor L21 was 5 nH, the capacitance of the capacitors C21 and C22 was 2 pF, and the resistance of the resistors R21 and R22 was 250Ω. The value of the load impedances Z1 and Z2 was 50Ω. The relative permeability of the magnetic layer M21 was 290 and the relative permeability of the dielectric layers N21 to N23 was 1. According to FIG. 11, it can be seen that the high-frequency device illustrated in FIG. 9 functions as an attenuator and, at the same time, functions as a low pass filter.

Figure 12:
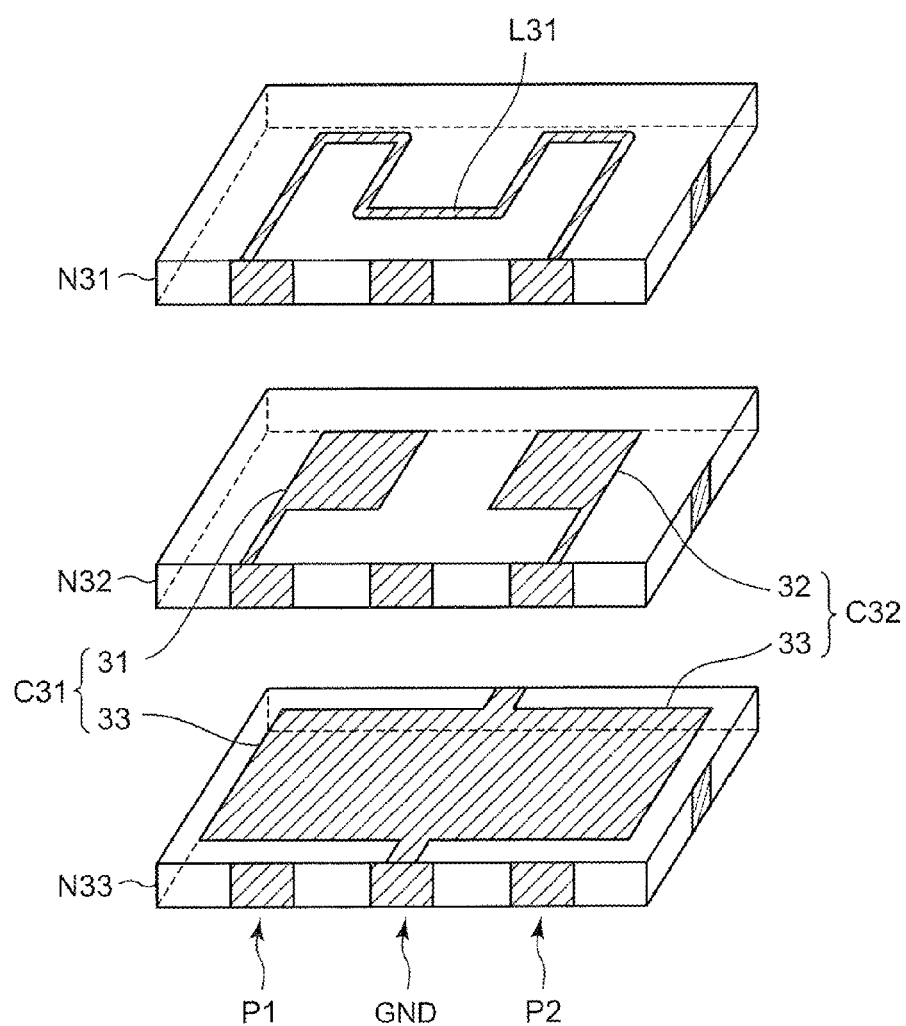
FIG. 12 is an exploded perspective view of the configuration of a high-frequency device according to a first comparative example.

FIG. 12 is an exploded perspective view of the configuration of a high-frequency device according to a first comparative example.

The high-frequency device illustrated in FIG. 12 includes a substrate that includes a plurality of layers stacked on top of one another including dielectric layers N31 to N33. The high-frequency device includes pattern conductors 31 to 33 each formed on one of the plurality of layers and an inductor L31 including a pattern conductor formed on the dielectric layer N31. The high-frequency device further includes terminals P1 and P2 and a ground terminal GND formed on each of the dielectric layers N31 to N33. When the dielectric layers N31 to N33 are stacked on top of one another, the terminals P1 and P2 and the ground terminal GND formed on one layer are respectively electrically connected to those on another layer. The pattern conductors 31 to 33 and the inductor L31 connect the terminals P1 and P2 and the ground terminal GND to one another, thereby forming a signal line for transmitting a high-frequency signal.

The signal line includes a first signal line connecting the terminals P1 and P2 to each other, a second signal line connecting a first connection node on the first signal line and the ground terminal GND to each other, and a third signal line connecting a second connection node on the first signal line and the ground terminal GND to each other. The first signal line includes the inductor L31 that includes a pattern conductor formed on the dielectric layer N31, between the first and second connection nodes. The second signal line includes a capacitor C31 formed of the pattern conductors 31 and 33 in such a manner that at least one dielectric layer N32 is sandwiched therebetween. The third signal line includes a capacitor C32 formed of the pattern conductors 32 and 33 in such a manner that the at least one dielectric layer N32 is sandwiched therebetween.

Figure 13:
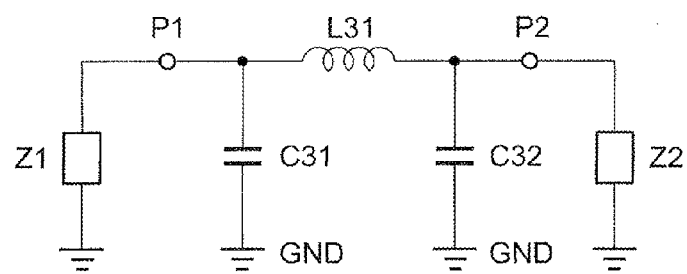
FIG. 13 is an equivalent circuit diagram of the high-frequency device illustrated in FIG. 12.

FIG. 13 is an equivalent circuit diagram of the high-frequency device illustrated in FIG. 12. This is the same as the equivalent circuit diagram illustrated in FIG. 10 except that the resistors R21 and R22 have been removed.

Figure 14:
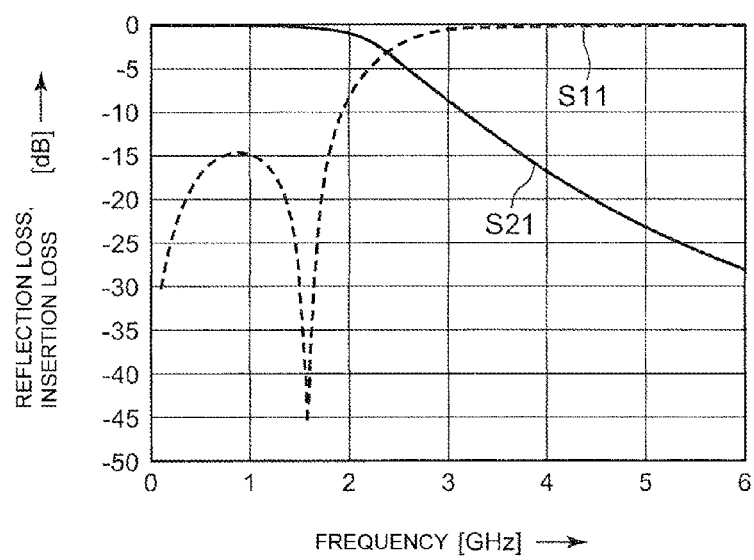
FIG. 14 is a graph illustrating the frequency characteristics of a reflection loss (S11) and an insertion loss (S21) according to the high-frequency device illustrated in FIG. 12.

FIG. 14 is a graph illustrating the frequency characteristics of a reflection loss (S11) and an insertion loss (S21) according to the high-frequency device illustrated in FIG. 12. When comparing FIG. 11 and FIG. 14, it can be seen that the high-frequency device illustrated in FIG. 12 does not function as an attenuator although functioning as a low pass filter.

Fourth Embodiment

Figure 15:
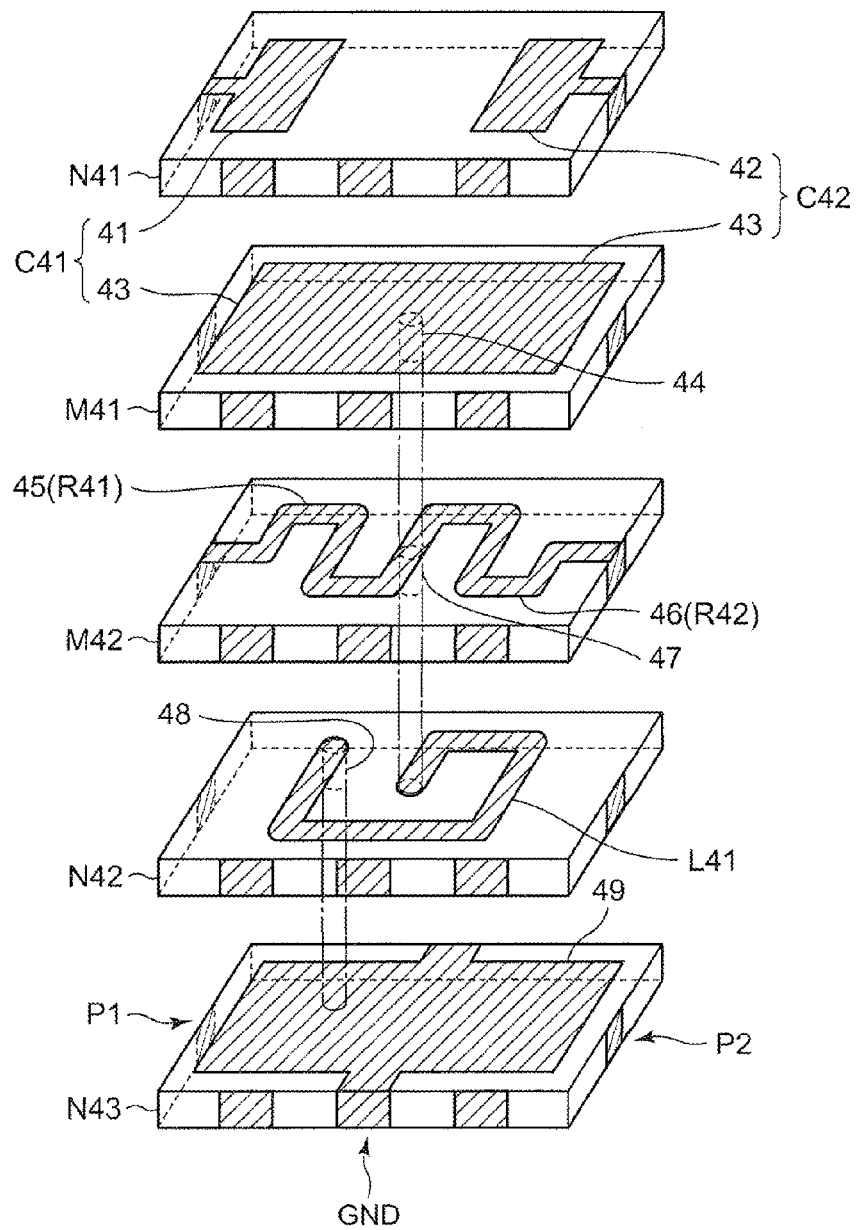
FIG. 15 is an exploded perspective view of the configuration of a high-frequency device according to a fourth embodiment of the present invention.

FIG. 15 is an exploded perspective view of the configuration of a high-frequency device according to a fourth embodiment of the present invention.

The high-frequency device illustrated in FIG. 15 includes a substrate that includes a plurality of layers stacked on top of one another including dielectric layers N41 to N43 and magnetic layers M41 and M42. The high-frequency device includes pattern conductors 41 to 43, 45, 46, and 49 each formed on one of the plurality of layers, via conductors 44, 47 and 48 each extending through one of the plurality of layers, and an inductor L41 including a pattern conductor formed on the at least one dielectric layer N42. The high-frequency device further includes terminals P1 and P2 and a ground terminal GND formed on each of the dielectric layers N41 to N43 and the magnetic layers M41 and M42. When the dielectric layers N41 to N43 and the magnetic layers M41 and M42 are stacked on top of one another, the terminals P1 and P2 and the ground terminal GND formed on one layer are respectively electrically connected to those on another layer. The pattern conductors 41 to 43, 45, 46, and 49, the via conductors 44, 47, and 48, and the inductor L41 connect the terminals P1 and P2 and the ground terminal GND to one another, thereby forming a signal line for transmitting a high-frequency signal.

The signal line includes a first signal line connecting the terminals P1 and P2 to each other, and a second signal line connecting a connection node on the first signal line and the ground terminal GND to each other. The first signal line includes, between the terminal P1 and the connection node connected to the second signal line, a capacitor C41 formed of the pattern conductors 41 and 43 in such a manner that the at least one dielectric layer N41 is sandwiched therebetween and no magnetic layers are sandwiched therebetween, and the pattern conductor 45 that is sandwiched between the two magnetic layers M41 and M42 and connected in parallel with the capacitor C41. The pattern conductor 45 sandwiched between the two magnetic layers M41 and M42 has a predetermined resistance R41 to a high-frequency signal. The first signal line includes, between the terminal P2 and the connection node connected to the second signal line, a capacitor C42 formed of the pattern conductors 42 and 43 in such a manner that the at least one dielectric layer N41 is sandwiched therebetween and no magnetic layers are sandwiched therebetween, and the pattern conductor 46 that is sandwiched between the two magnetic layers M41 and M42 and connected in parallel with the capacitor C42. The pattern conductor 46 sandwiched between the two magnetic layers M41 and M42 has a predetermined resistance R42 to a high-frequency signal. The second signal line includes the inductor L41 including a pattern conductor formed on the at least one dielectric layer N42.

Figure 16:
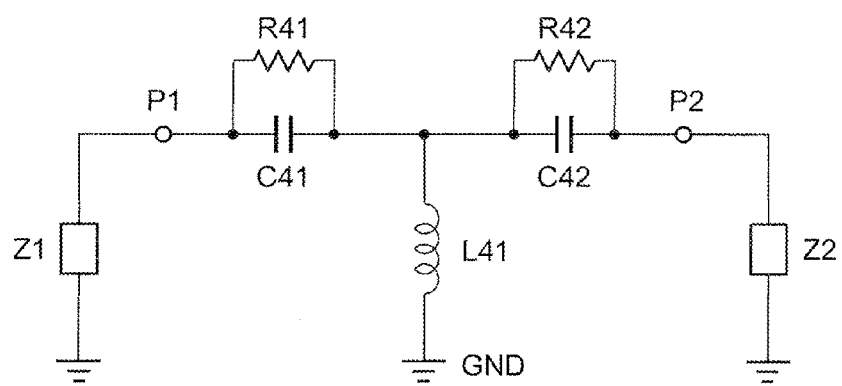
FIG. 16 is an equivalent circuit diagram of the high-frequency device illustrated in FIG. 15.

FIG. 16 is an equivalent circuit diagram of the high-frequency device illustrated in FIG. 15. The high-frequency device illustrated in FIG. 15 functions as an attenuator and, at the same time, functions as a T-type high pass filter.

Figure 17:
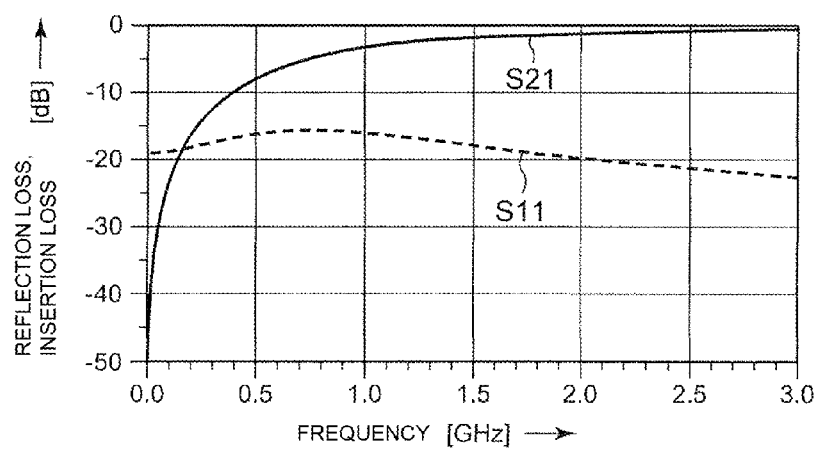
FIG. 17 is a graph illustrating the frequency characteristics of a reflection loss (S11) and an insertion loss (S21) according to the high-frequency device illustrated in FIG. 15.

FIG. 17 is a graph illustrating the frequency characteristics of a reflection loss (S11) and an insertion loss (S21) according to the high-frequency device illustrated in FIG. 15. The graph of FIG. 17 illustrates simulation results regarding a high-frequency device having the following parameter values. The capacitance of the capacitors C41 and C42 was 5 pF, the resistance of the resistors R41 and R42 was 40Ω, and the inductance of the inductor L41 was 10 nH. The value of the load impedance Z1 and Z2 was 50Ω. The relative permeability of the magnetic layers M41 and M42 was 290 and the relative permeability of the dielectric layers N41 to N43 was 1. According to FIG. 17, it can be seen that the high-frequency device illustrated in FIG. 15 functions as an attenuator and, at the same time, functions as a high pass filter.

Fifth Embodiment

Figure 18:
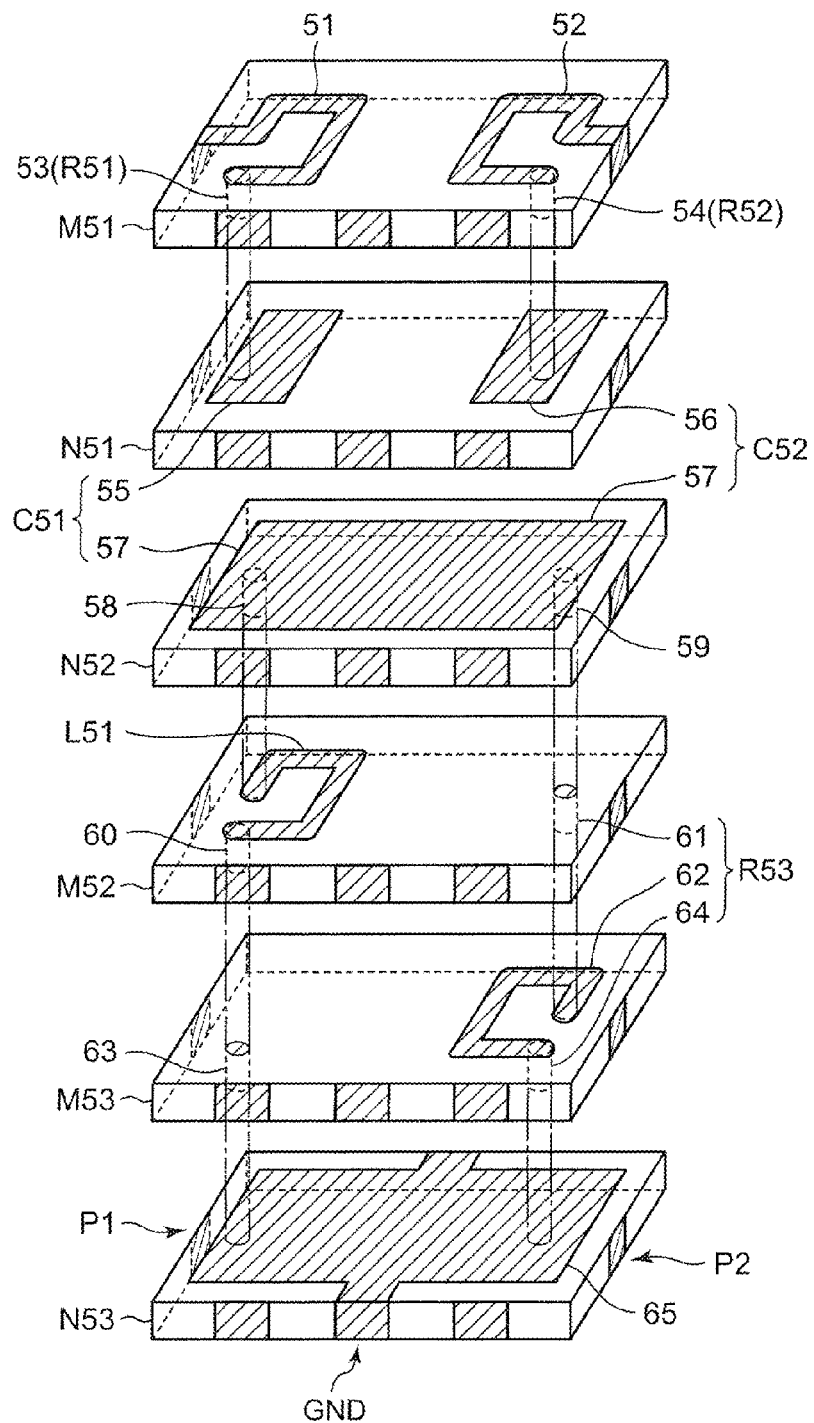
FIG. 18 is an exploded perspective view of the configuration of a high-frequency device according to a fifth embodiment of the present invention.

FIG. 18 is an exploded perspective view of the configuration of a high-frequency device according to a fifth embodiment of the present invention.

The high-frequency device illustrated in FIG. 18 includes a substrate that includes a plurality of layers stacked on top of one another including dielectric layers N51 to N53 and magnetic layers M51 to M53. The high-frequency device includes pattern conductors 51, 52, 55 to 57, 62, and 65 each formed on one of the plurality of layers, via conductors 53, 54, 58 to 61, 63, and 64 each extending through one of the plurality of layers, and an inductor L51 including a pattern conductor formed on the magnetic layer M52 facing the bottom surface of the at least one dielectric layer N52. The high-frequency device further includes terminals P1 and P2 and a ground terminal GND on each of the dielectric layers N51 to N53 and the magnetic layers M51 and M53. When the dielectric layers N51 to N53 and the magnetic layers M51 and M53 are stacked on top of one another, the terminals P1 and P2 and the ground terminal GND formed on one layer are respectively electrically connected to those on another layer. The pattern conductors 51, 52, 55 to 57, 62, and 65, the via conductors 53, 54, 58 to 61, 63, and 64, and the inductor L51 connect the terminals P1 and P2 and the ground terminal GND to one another, thereby forming a signal line for transmitting a high-frequency signal.

The signal line includes a first signal line connecting the terminals P1 and P2 to each other, and a second signal line connecting a connection node on the first signal line and the ground terminal GND to each other. The first signal line includes, between the terminal P1 and the connection node connected to the second signal line, a capacitor C51 formed of the pattern conductors 55 and 57 in such a manner that the at least one dielectric layer N51 is sandwiched therebetween and no magnetic layers are sandwiched therebetween and the via conductor 53 that extends through the single magnetic layer M51. The via conductor 53 that extends through the single magnetic layer M51 has a predetermined resistance R51 to a high-frequency signal. The first signal line includes, between the terminal P2 and the connection node connected to the second signal line, a capacitor C52 formed of the pattern conductors 56 and 57 in such a manner that at the least one dielectric layer N51 is sandwiched therebetween and no magnetic layers are sandwiched therebetween and the via conductor 54 that extends through the single magnetic layer M51. The via conductor 54 that extends through the single magnetic layer M51 has a resistance R52 to a high-frequency signal. The second signal line includes a third signal line that includes via conductors 61 and 64 that extend through respective magnetic layers and a pattern conductor 62 sandwiched between two magnetic layers, and an inductor L51 that includes a pattern conductor formed on the magnetic layer M52 facing the bottom surface of the at least one dielectric layer N52 and that is connected in parallel with the third signal line. The via conductors 61 and 64 that extend through respective magnetic layers and the pattern conductor 62 sandwiched between the two magnetic layers have a predetermined resistance R53 to a high-frequency signal.

Figure 19:
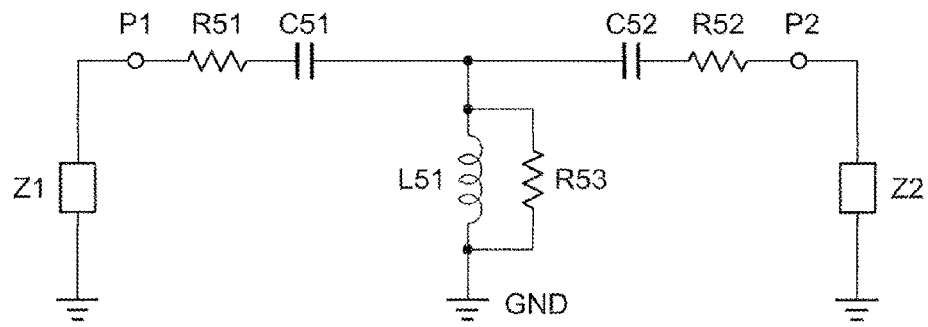
FIG. 19 is an equivalent circuit diagram of the high-frequency device illustrated in FIG. 18.

FIG. 19 is an equivalent circuit diagram of the high-frequency device illustrated in FIG. 18. The high-frequency device illustrated in FIG. 18 functions as an attenuator and, at the same time, functions as a T-type high pass filter.

Figure 20:
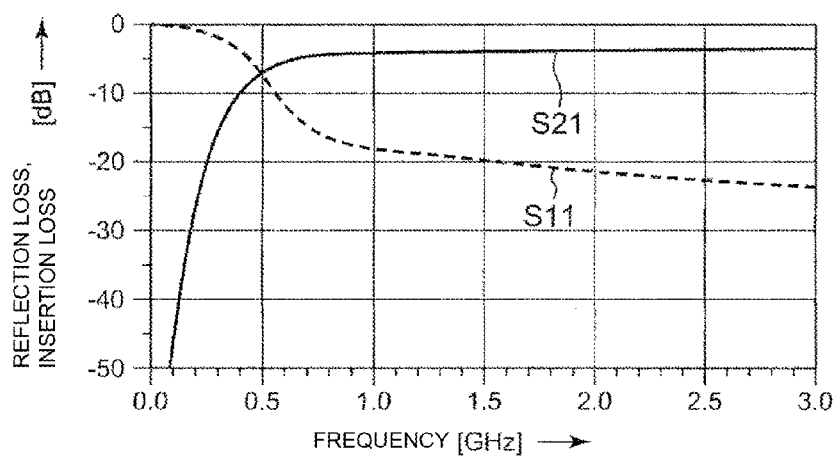
FIG. 20 is a graph illustrating the frequency characteristics of a reflection loss (S11) and an insertion loss (S21) according to the high-frequency device illustrated in FIG. 18.

FIG. 20 is a graph illustrating the frequency characteristics of a reflection loss (S11) and an insertion loss (S21) according to the high-frequency device illustrated in FIG. 18. The graph of FIG. 20 illustrates simulation results regarding a high-frequency device having the following parameter values. The capacitance of the capacitors C51 and C52 was 5 pF, the resistance of the resistors R51 and R52 was 10Ω, the resistance of the resistance R53 was 150Ω, and the inductance of the inductor L51 was 10 nH. The value of the load impedances Z1 and Z2 was 50Ω. The relative permeability of the magnetic layers M51 to M53 was 290 and the relative permeability of the dielectric layers N51 to N53 was 1. According to FIG. 20, it can be seen that the high-frequency device illustrated in FIG. 18 functions as an attenuator and, at the same time, functions as a high pass filter.

Figure 21:
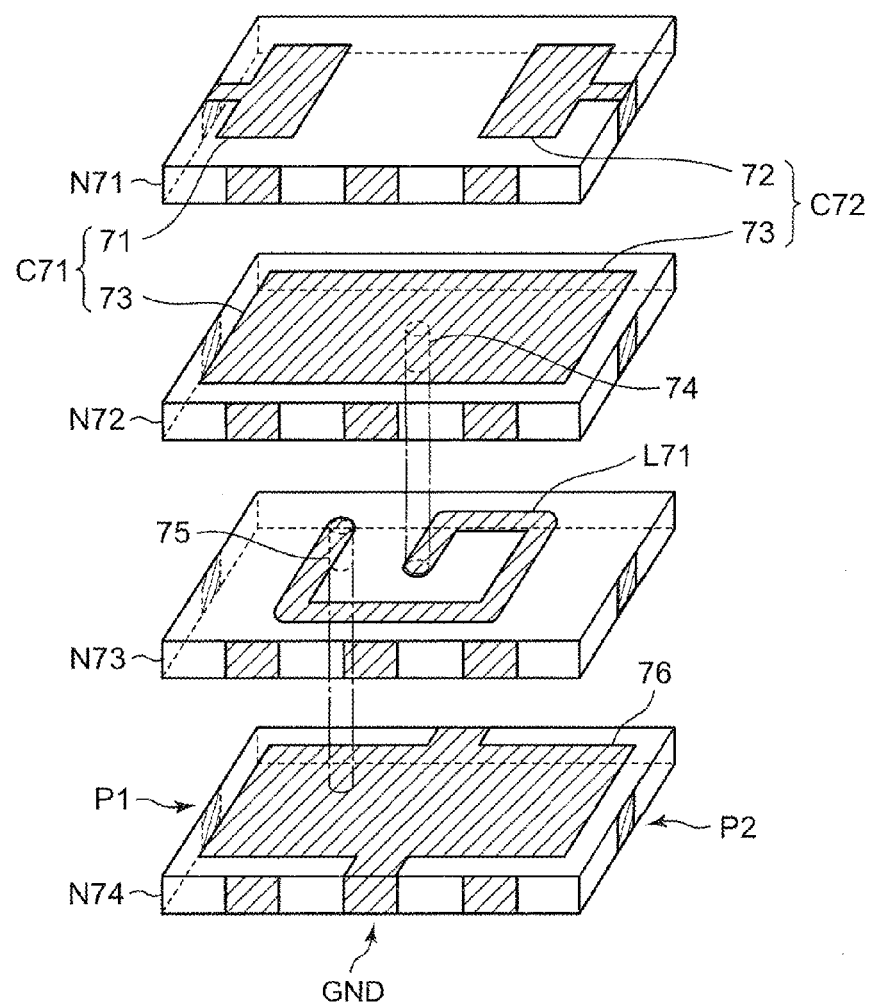
FIG. 21 is an exploded perspective view of the configuration of a high-frequency device according to a second comparative example.

FIG. 21 is an exploded perspective view of the configuration of a high-frequency device according to a second comparative example.

The high-frequency device illustrated in FIG. 21 includes a substrate that includes a plurality of layers stacked on top of one another including dielectric layers N71 to N74. The high-frequency device includes pattern conductors 71 to 73, and 76 each formed on one of the plurality of layers, via conductors 74 and 75 each extending through one of the plurality of layers, and an inductor L71 including a pattern conductor formed on the dielectric layer N73. The high-frequency device further includes terminals P1 and P2 and a ground terminal GND formed on each of the dielectric layers N71 to N74. When the dielectric layers N71 to N74 are stacked on top of one another, the terminals P1 and P2 and the ground terminal GND formed on one layer are respectively electrically connected to those on another layer. The pattern conductors 71 to 73 and 76, the via conductors 74 and 75, and the inductor L71 connect the terminals P1 and P2 and the ground terminal GND to one another, thereby forming a signal line for transmitting a high-frequency signal.

The signal line includes a first signal line connecting the terminals P1 and P2 to each other, a second signal line connecting a connection node on the first signal line and the ground terminal GND to each other. The first signal includes, between the terminal P1 and the connection node connected to the second signal line, a capacitor C71 formed of the pattern conductors 71 and 73 in such a manner that the at least one dielectric layer N71 is sandwiched therebetween. The first signal line includes, between the terminal P2 and the connection node connected to the second signal line, a capacitor C72 formed of the pattern conductors 72 and 73 in such a manner that the at least one dielectric layer N71 is sandwiched therebetween. The second signal line includes an inductor L71 including a pattern conductor formed on the dielectric layer N73.

Figure 22:
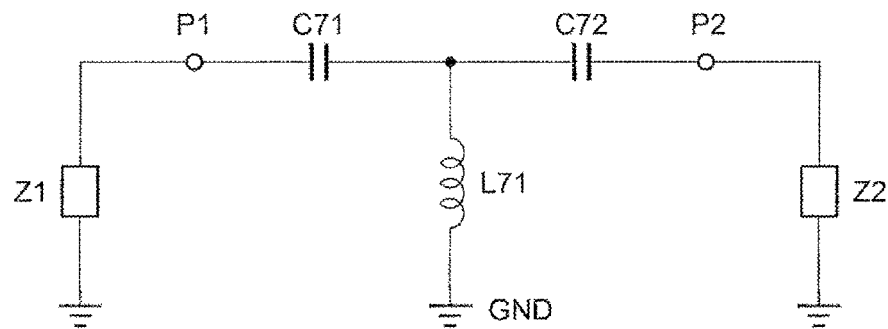
FIG. 22 is an equivalent circuit diagram of the high-frequency device illustrated in FIG. 21.

FIG. 22 is an equivalent circuit diagram of the high-frequency device illustrated in FIG. 21. The high-frequency device illustrated in FIG. 21 functions as a T-type high pass filter.

Figure 23:
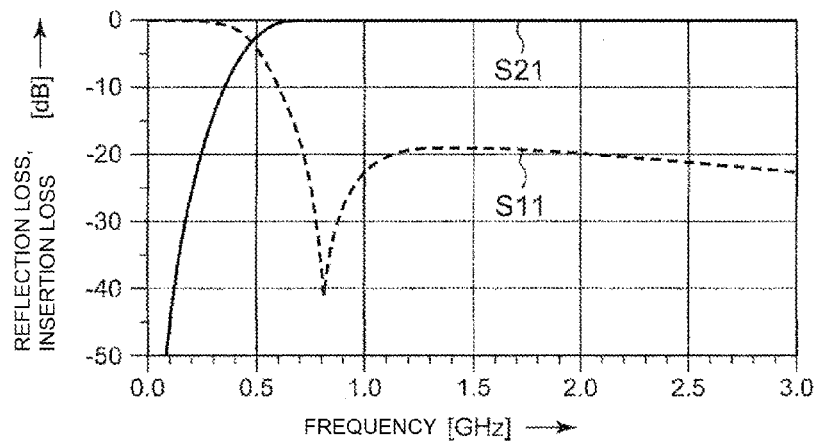
FIG. 23 is a graph illustrating the frequency characteristics of a reflection loss (S11) and an insertion loss (S21) according to the high-frequency device illustrated in FIG. 21.

FIG. 23 is a graph illustrating the frequency characteristics of a reflection loss (S11) and an insertion loss (S21) according to the high-frequency device illustrated in FIG. 21. The graph of FIG. 23 illustrates simulation results regarding a high-frequency device having the following parameter values. The capacitance of the capacitors C71 and C72 was 5 pF, and the inductance of the inductor L71 was 10 nH. The value of the load impedances Z1 and Z2 was 50Ω. The relative permeability of the dielectric layers N71 to N74 was 1. According to FIG. 23, it can be seen that the high-frequency device illustrated in FIG. 21 does not function as an attenuator, although functioning as a high pass filter.

Sixth Embodiment

Figure 24:
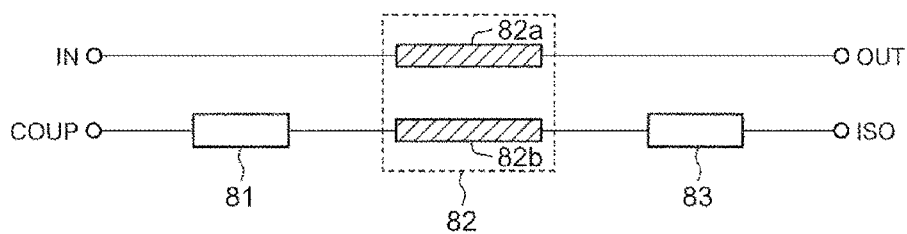
FIG. 24 is a block diagram illustrating the configuration of a directional coupler according to a sixth embodiment of the present invention.

FIG. 24 is a block diagram illustrating the configuration of a directional coupler according to a sixth embodiment of the present invention. The directional coupler illustrated in FIG. 24 is characterized in that the high-frequency devices according to the first to fifth embodiments are provided as attenuators.

The directional coupler illustrated in FIG. 24 includes four ports IN, OUT, COUP, and ISO, a transmission line 82a provided between the ports IN and OUT, a transmission line 82b provided between the ports COUP and ISO and electromagnetically coupled with the transmission line 82a, an attenuator 81 provided between the port COUP and the transmission line 82b, and an attenuator 83 provided between the port ISO and the transmission line 82b. A transmission line portion 82 including the transmission lines 82a and 82b electromagnetically coupled with each other is configured similarly to existing directional couplers. Each of the attenuators 81 and 83 is the high-frequency device according to any one of the first to fifth embodiments.

Next, an embodiment of the directional coupler illustrated in FIG. 24 will be described with reference to FIGS. 25 to 27.

Figure 25:
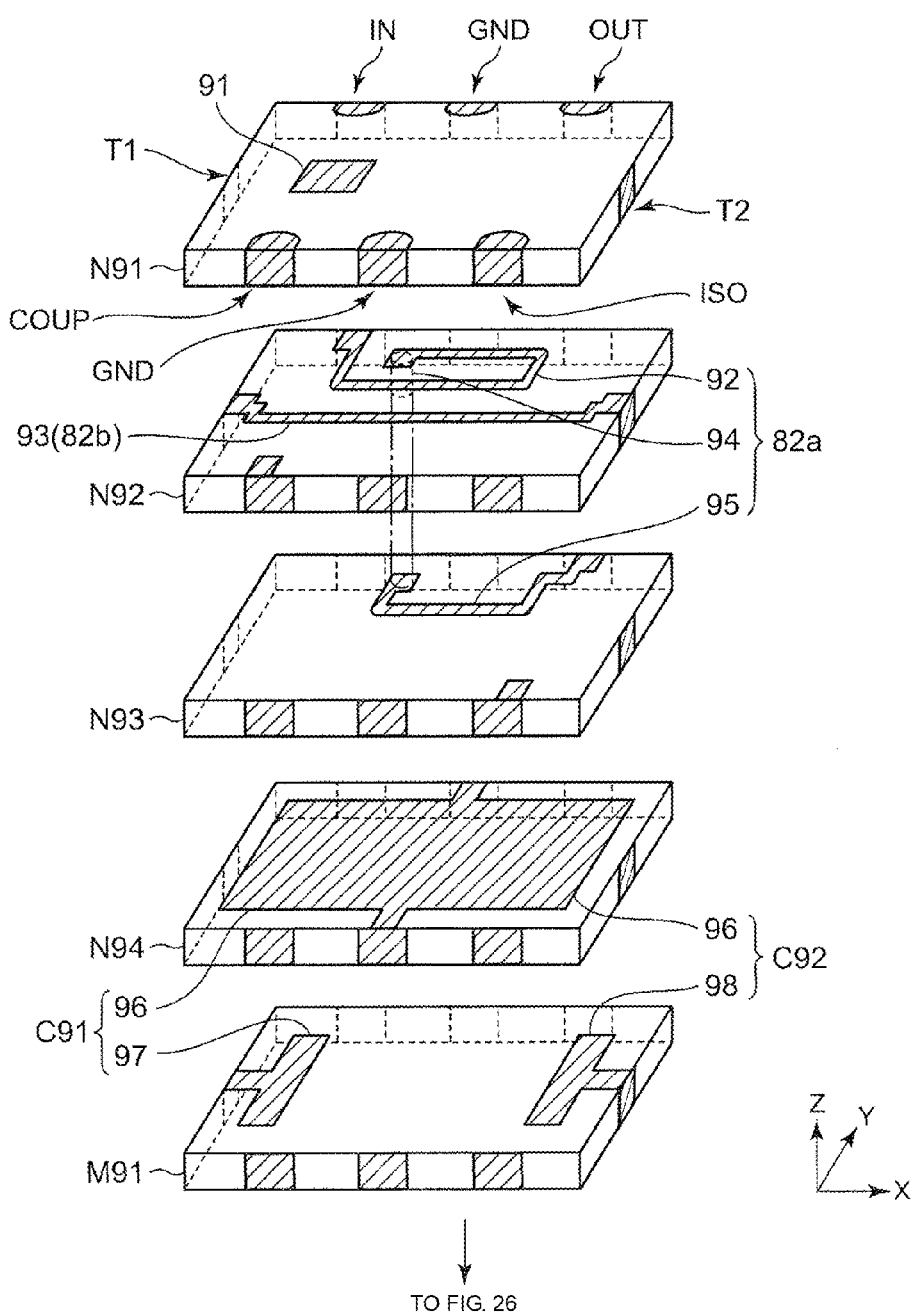
FIG. 25 is a first portion of an exploded perspective view of the configuration of the directional coupler illustrated in FIG. 24.
Figure 26:
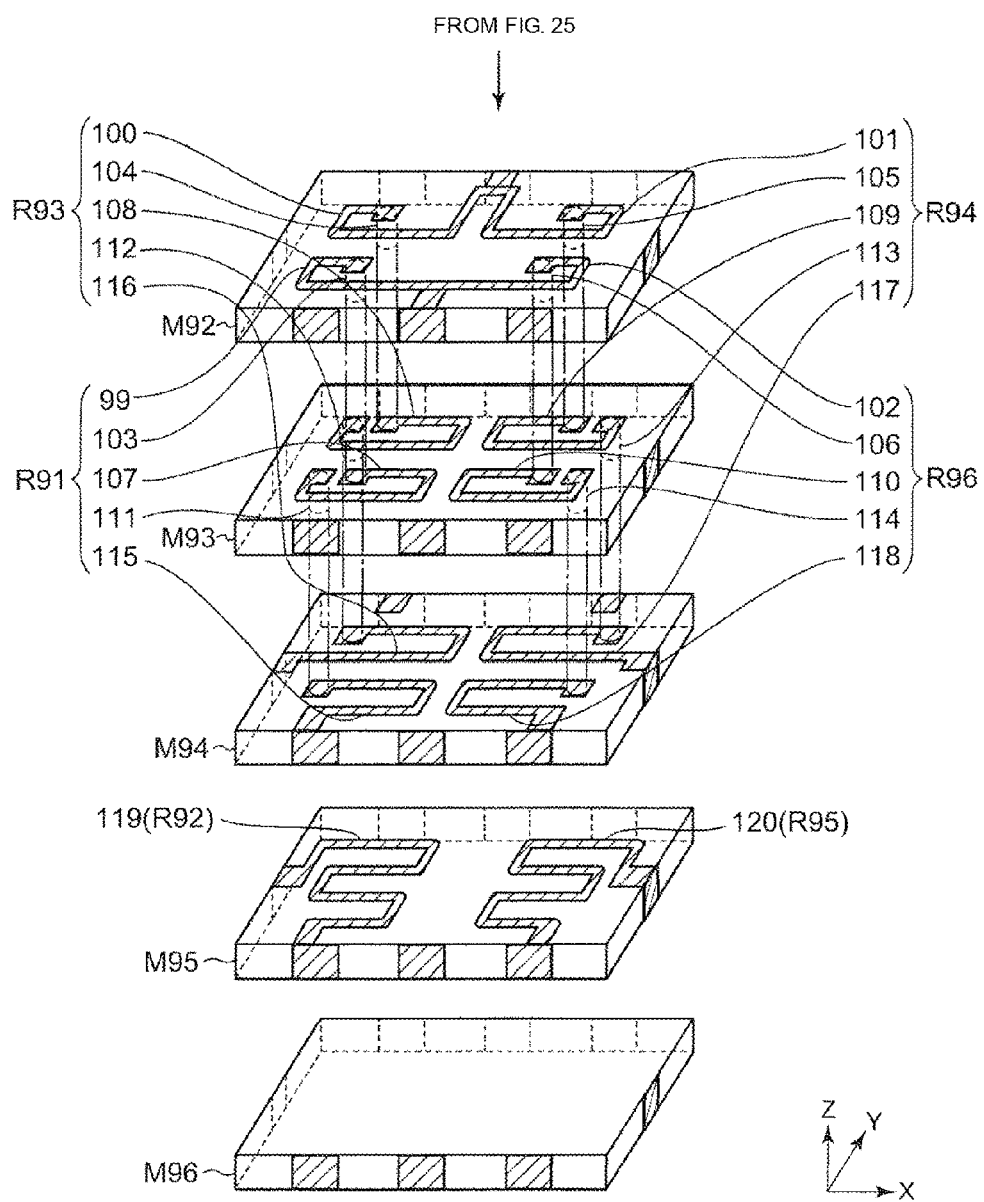
FIG. 26 is a second portion of the exploded perspective view of the configuration of the directional coupler illustrated in FIG. 24.

FIG. 25 and FIG. 26 are exploded perspective views of the configuration of the directional coupler illustrated in FIG. 24.

The high-frequency device illustrated in FIG. 25 and FIG. 26 includes a substrate that includes a plurality of layers stacked on top of one another including dielectric layers N91 to N94 and magnetic layers M91 to M96. The high-frequency device includes pattern conductors 92, 93, 95, 96 to 102, 107 to 110, and 115 to 120 each formed on one of the plurality of layers and via conductors 94, 103 to 106, and 111 to 114 each extending through one of the plurality of layers. The high-frequency device further includes terminals IN, OUT, COUP, ISO, T1, and T2 and a ground terminal GND formed on each of the dielectric layers N91 to N94 and the magnetic layers M91 to M96. The terminals IN, OUT, COUP, ISO correspond to the respective ports with the same reference symbols illustrated in FIG. 24. The terminals T1 and T2 are terminals for internal connection of the high-frequency device. When the dielectric layers N91 to N94 and the magnetic layers M91 to M96 are stacked on top of one another, the terminals IN, OUT, COUP, ISO, T1, and T2 and the ground terminal GND formed on one layer are respectively electrically connected to those on another layer.

The pattern conductors 92 and 95 respectively formed on the dielectric layers N92 and N93 and the via conductor 94 extending through the dielectric layer N92 correspond to the transmission line 82a illustrated in FIG. 24. The pattern conductor 93 formed on the dielectric layer N92 corresponds to the transmission line 82b illustrated in FIG. 24.

Next, a portion corresponding to the attenuator 81 illustrated in FIG. 24 will be described. The pattern conductors 96, 97, 99, 100, 107, 108, 115, 116, and 119 and the via conductors 103, 104, 111, and 112 connect the terminal COUP and the transmission line 82b to each other, thereby forming a signal line for transmitting a high-frequency signal. This signal line includes a first signal line connecting the terminal COUP and the transmission line 82b to each other, a second signal line connecting a first connection node on the first signal line and the ground terminal GND to each other, and a third signal line connecting a second connection node on the first signal line and the ground terminal GND to each other. The first signal line includes, between the first and second connection nodes, at least one of a via conductor extending through one magnetic layer and a pattern conductor sandwiched between two magnetic layers. In the directional coupler illustrated in FIG. 25 and FIG. 26, the first signal line includes the pattern conductor 119 sandwiched between the magnetic layers M94 and M95. This portion of the first signal line has a predetermined resistance R92 to a high-frequency signal. The second signal line includes at least one of a via conductor that extends through one magnetic layer and a pattern conductor sandwiched between two magnetic layers. In the directional coupler illustrated in FIG. 25 and FIG. 26, the second signal line includes the via conductors 103 and 111 respectively extending through the magnetic layers M92 and M93 and the pattern conductors 99, 107, and 115 formed among the magnetic layers M91 to M94. This portion of the second signal line has a predetermined resistance R91 to a high-frequency signal. The third signal line includes a fourth signal line that includes at least one of a via conductor that extends through one magnetic layer and a pattern conductor sandwiched between two magnetic layers, and a capacitor C91 that is formed of the pattern conductors 96 and 97 in such a manner that the at least one dielectric layer N94 is sandwiched therebetween and no magnetic layers are sandwiched therebetween and that is connected in parallel with the fourth signal line. In the directional coupler illustrated in FIG. 25 and FIG. 26, the fourth signal line includes the via conductors 104 and 112 that respectively extend through the magnetic layers M92 and M93 and the pattern conductors 100, 108, and 116 formed among the magnetic layers M91 to M94. This portion of the third signal line has a predetermined resistance R93 to a high-frequency signal.

Next, a portion corresponding to the attenuator 83 illustrated in FIG. 24 will be described. The pattern conductors 96, 98, 101, 102, 109, 110, 117, 118, and 120 and the via conductors 105, 106, 113, and 114 connect the terminal ISO and the transmission line 82b to each other, thereby forming a signal line for transmitting a high-frequency signal. This signal line includes a fifth signal line connecting the terminal ISO and the transmission line 82b to each other, a sixth signal line connecting a first connection node on the fifth signal line and the ground terminal GND to each other, and a seventh signal line connecting a second connection node on the fifth signal line and the ground terminal GND to each other. The fifth signal line includes, between the first and second connection nodes, at least one of a via conductor that extends through one magnetic layer and a pattern conductor sandwiched between two magnetic layers. In the directional coupler illustrated in FIG. 25 and FIG. 26, the fifth signal line includes the pattern conductor 120 sandwiched between the magnetic layers M94 and M95. This portion of the fifth signal line has a predetermined resistance R95 to a high-frequency signal. The sixth signal line includes at least one of a via conductor that extends through one magnetic layer and a pattern conductor sandwiched between two magnetic layers. In the directional coupler illustrated in FIG. 25 and FIG. 26, the sixth signal line includes the via conductors 106 and 114 that respectively extend through the magnetic layers M92 and M93 and the pattern conductors 102, 110, and 118 formed among the magnetic layers M91 to M94. This portion of the sixth signal line has a predetermined resistance R96 to a high-frequency signal. The seventh signal line includes an eighth signal line that includes at least one of a via conductor that extends through one magnetic layer and a pattern conductor sandwiched between two magnetic layers, and a capacitor C92 that is formed of the pattern conductors 96 and 98 in such a manner that the at least one dielectric layer N94 is sandwiched therebetween and no magnetic layers are sandwiched therebetween and that is connected in parallel with the eighth signal line. In the directional coupler illustrated in FIG. 25 and FIG. 26, the eighth signal line includes the via conductors 105 and 113 that respectively extend through the magnetic layers M92 and M93 and the pattern conductors 101, 109, and 117 formed among the magnetic layers M91 to M94. This portion of the seventh signal line has a predetermined resistance R94 to a high-frequency signal.

Note that the directional coupler illustrated in FIG. 25 and FIG. 26 may be provided with a marker 91 on the surface thereof for determining the orientation of the device.

Figure 27:
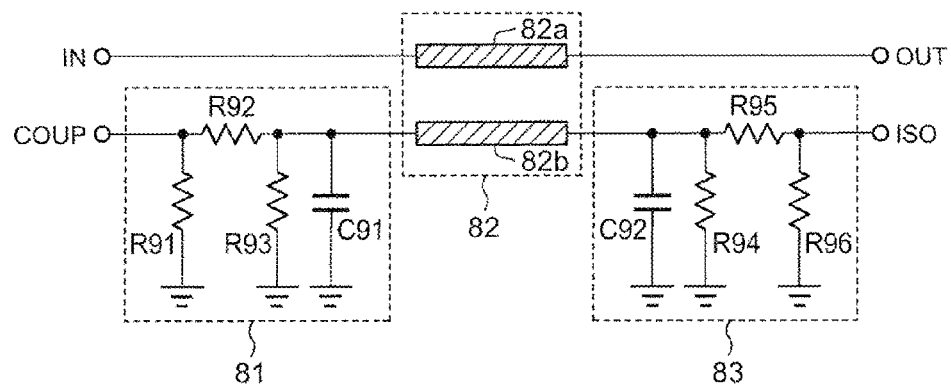
FIG. 27 is an equivalent circuit diagram of the directional coupler illustrated in FIG. 25 and FIG. 26.

FIG. 27 is an equivalent circuit diagram of the directional coupler illustrated in FIG. 25 and FIG. 26. The high-frequency device according to any one of the first to fifth embodiments may be used as the attenuators 81 and 83, instead of using the configuration illustrated in FIG. 25 and FIG. 26.

According to the directional coupler illustrated in FIG. 25 and FIG. 26, by forming the transmission lines 82a and 82b at dielectric layers and forming the resistances R91 to R96 of the attenuators 81 and 83 at magnetic layers, the transmission line portion 82 and the attenuators 81 and 83 can be provided in a single chip. The directional coupler can have an arbitrary degree of coupling through adjustment of the attenuations and impedances of the attenuators 81 and 83. At this time, since the degree of coupling of the transmission line portion 82 is accompanied by attenuation, variations generated as a result of the impedance matching of the directional coupler being degraded can be reduced by the amount of attenuation. Variations in coupling signal can be reduced by adjusting the attenuations and impedances of the attenuators 81 and 83.

As illustrated in FIG. 25 and FIG. 26, by adjusting the numbers of the pattern electrodes and via conductors included in the resistors R91 to R96, the resistance values can be adjusted in a wide range.

According to the directional coupler illustrated in FIG. 24 to FIG. 27, a directional coupler that includes a high-frequency circuit including an attenuator and that is formed as a single chip can be provided.

Modifications

In addition to the configurations of the embodiments described above, additional resistors, capacitors, and/or inductors may be included.

Although descriptions have been made in the present specification assuming that a predetermined resistance to a high-frequency signal is generated only in the case where a pattern electrode is sandwiched between two magnetic layers, a device realized in the case where the pattern electrode is formed between a magnetic layer and a dielectric layer may be also made to function as a device having a predetermined resistance to a high-frequency signal.

Although a high-frequency device that functions as an attenuator and, at the same time, functions as a low pass filter or a high pass filter has been described in the present specification, a high-frequency device that functions as an attenuator and, at the same time, functions as a band pass filter may be formed.

Further, by adjusting the facing area of pattern conductors forming a capacitor and the thickness or permeability of dielectric layers, desired impedance can be realized through adjustment of the capacitance of the capacitor. Note that the magnetic layers and dielectric layers are not limited to ceramic layers using a low-temperature co-fired ceramic (LTCC), and may be layers using a resin, such as magnetic resin layers formed by dispersing magnetic powder into a resin.

INDUSTRIAL APPLICABILITY

According to the present invention, a high-frequency device in which undesired generation of reflected waves is suppressed can be provided. Further, by reducing the size of the high-frequency device, parasitic components can be reduced. An attenuator and a directional coupler in which undesired reflected waves outside of a desired band are suppressed can be provided.

According to the present invention, a small attenuator in which variations in attenuation and impedance are reduced can be provided.

According to the present invention, since any attenuation can be obtained without generation of reflection of a high-frequency signal, performance can be increased when the present invention is applied to attenuators, filters, or directional couplers.

Reflection characteristics can be adjusted in any frequency band by adjusting impedance using resistors, inductors, and capacitors.

REFERENCE SIGNS LIST 1, 4, 5, 11, 14, 15, 17, 21 to 24, 27, 31 to 33, 41 to 43, 45, 46, 48, 49, 51, 52, 55 to 57, 62, 65, 71 to 73, 76, 92, 93, 95, 96 to 102, 107 to 110, 115 to 120 pattern conductors
2, 3, 12, 13, 16, 25, 26, 44, 47, 48, 53, 54, 58 to 61, 63, 64, 74, 75, 94, 103 to 106, 111 to 114 via conductors
81, 83 attenuators
82 transmission line portion
82a, 82b transmission lines
91 marker
C1, C11, C21, C22, C31, C32, C51, C52, C71, C72, C91, C92 capacitors
GND ground terminal
L21, L31, L51, L71 inductors
R1, R2, R11 to R13, R21, R22, R41, R42, R51 to R53, R91 to R96 resistances
M1, M2, M11 to M13, M21, M41, M42, M51 to M53, M91 to M96 magnetic layers
N1 to N3, N11 to N13, N21 to N23, N31 to N33, N41 to N43, N51 to N53, N71 to N74, N91 to N94 dielectric layers
P1, P2, T1, T2 terminals
Z1, Z2 load impedances

The invention claimed is:
1. A high-frequency device comprising:
a substrate including a plurality of layers that are stacked on top of one another and include at least one dielectric layer and at least one magnetic layer;
first and second terminals;

at least one pattern conductor formed on one of the plurality of layers;
at least one via conductor extending through one of the plurality of layers,
wherein the at least one pattern conductor and the at least one via conductor connect the first and second terminals to each other and form a signal line that transmits a predetermined high-frequency signal,
wherein a first portion of the signal line includes at least one of: a via conductor extending through one magnetic layer and a pattern conductor sandwiched between two magnetic layers,
wherein the first portion has a predetermined resistance to the high-frequency signal,
wherein a second portion of the signal line includes at least one of a capacitor formed of two pattern electrodes in such a manner that at least one dielectric layer is sandwiched therebetween and no magnetic layers are sandwiched therebetween, and an inductor including a pattern conductor formed on at least one dielectric layer,
wherein the high-frequency device has predetermined impedances to the high-frequency signal at the first and second terminals; and
a ground terminal,
wherein the signal line includes a first signal line connecting the first and second terminals to each other, and a second signal line connecting a connection node on the first signal line and the ground terminal to each other,
wherein the first signal line includes a first capacitor between the first terminal and the connection node connected to the second signal line, the first capacitor being formed of two pattern conductors in such a manner that at least one dielectric layer is sandwiched therebetween and no magnetic layers are sandwiched therebetween,
wherein the first signal line includes a first pattern conductor sandwiched between two magnetic layers and connected in parallel with the first capacitor,
wherein the first signal line includes a second capacitor between the second terminal and the connection node connected to the second signal line, the second capacitor being formed of two pattern conductors in such a manner that at least one dielectric layer is sandwiched therebetween and no magnetic layers are sandwiched therebetween,
wherein the first signal line includes a second pattern conductor sandwiched between two magnetic layers and connected in parallel with the second capacitor, and
wherein the second signal line includes an inductor including a pattern conductor formed on at least one dielectric layer.

2. A high-frequency device comprising:
a substrate including a plurality of layers that are stacked on top of one another and include at least one dielectric layer and at least one magnetic layer;
first and second terminals;
at least one pattern conductor formed on one of the plurality of layers;
at least one via conductor extending through one of the plurality of layers,
wherein the at least one pattern conductor and the at least one via conductor connect the first and second terminals to each other and form a signal line that transmits a predetermined high-frequency signal,
wherein a first portion of the signal line includes at least one of: a via conductor extending through one magnetic layer and a pattern conductor sandwiched between two magnetic layers,
wherein the first portion has a predetermined resistance to the high-frequency signal,
wherein a second portion of the signal line includes at least one of a capacitor formed of two pattern electrodes in such a manner that at least one dielectric layer is sandwiched therebetween and no magnetic layers are sandwiched therebetween, and an inductor including a pattern conductor formed on at least one dielectric layer,
wherein the high-frequency device has predetermined impedances to the high-frequency signal at the first and second terminals; and
a ground terminal,
wherein the signal line includes a first signal line connecting the first and second terminals to each other, and a second signal line connecting a connection node on the first signal line and the ground terminal to each other,
wherein the first signal line includes a first capacitor between the first terminal and the connection node connected to the second signal line, the first capacitor being formed of two pattern electrodes in such a manner that at least one dielectric layer is sandwiched therebetween and no magnetic layers are sandwiched therebetween,
wherein the first signal line includes a first via conductor extending through one magnetic layer,
wherein the first signal line includes a second capacitor between the second terminal and the connection node connected to the second signal line, the second capacitor being formed of two pattern conductors in such a manner that at least one dielectric layer is sandwiched therebetween and no magnetic layers are sandwiched therebetween,
wherein the first signal line includes a second via conductor extending through one magnetic layer,
wherein the second signal line includes a third signal line including at least one of: a via conductor extending through one magnetic layer and a pattern conductor sandwiched between two magnetic layers, and
wherein the second signal line includes an inductor including a pattern conductor formed on at least one dielectric layer and connected in parallel with the third signal line.

3. A high-frequency device comprising:
a substrate including a plurality of layers that are stacked on top of one another and include at least one dielectric layer and at least one magnetic layer;
first and second terminals;
at least one pattern conductor formed on one of the plurality of layers;
at least one via conductor extending through one of the plurality of layers,
wherein the at least one pattern conductor and the at least one via conductor connect the first and second terminals to each other and form a signal line that transmits a predetermined high-frequency signal,
wherein a first portion of the signal line includes at least one of: a via conductor extending through one magnetic layer and a pattern conductor sandwiched between two magnetic layers,
wherein the first portion has a predetermined resistance to the high-frequency signal,
wherein a second portion of the signal line includes at least one of a capacitor formed of two pattern electrodes in such a manner that at least one dielectric layer is sandwiched therebetween and no magnetic layers are sandwiched therebetween, and an inductor including a pattern conductor formed on at least one dielectric layer, and wherein the high-frequency device has predetermined impedances to the high-frequency signal at the first and second terminals; and a ground terminal, wherein the signal line includes a first signal line connecting the first and second terminals to each other, a second signal line connecting a first connection node on the first signal line and the ground terminal to each other, and a third signal line connecting a second connection node on the first signal line and the ground terminal to each other, wherein the first signal line includes, between the first and second connection nodes, a via conductor extending through one magnetic layer and a pattern conductor sandwiched between two magnetic layers, wherein the second signal line includes a via conductor extending through one magnetic layer and a pattern conductor sandwiched between two magnetic layers, and wherein the third signal line includes a fourth signal line including a via conductor extending through one magnetic layer and a pattern conductor sandwiched between two magnetic layers, and wherein the third signal line includes a capacitor formed in such a manner that at least one dielectric layer is sandwiched therebetween and no magnetic layers are sandwiched therebetween and connected in parallel with the fourth signal line.

4. A high-frequency device comprising:

a substrate including a plurality of layers that are stacked on top of one another and include at least one dielectric layer and at least one magnetic layer;

first and second terminals;

at least one pattern conductor formed on one of the plurality of layers;

at least one via conductor extending through one of the plurality of layers, wherein the at least one pattern conductor and the at least one via conductor connect the first and second terminals to each other and form a signal line that transmits a predetermined high-frequency signal, wherein a first portion of the signal line includes at least one of: a via conductor extending through one magnetic layer and a pattern conductor sandwiched between two magnetic layers, wherein the first portion has a predetermined resistance to the high-frequency signal, wherein a second portion of the signal line includes at least one of a capacitor formed of two pattern electrodes in such a manner that at least one dielectric layer is sandwiched therebetween and no magnetic layers are sandwiched therebetween, and an inductor including a pattern conductor formed on at least one dielectric layer, wherein the high-frequency device has predetermined impedances to the high-frequency signal at the first and second terminals; and a ground terminal, wherein the signal line includes a first signal line connecting the first and second terminals to each other, a second signal line connecting a first connection node on the first signal line and the ground terminal to each other, and a third signal line connecting a second connection node on the first signal line and the ground terminal to each other, wherein the first signal line includes an inductor between the first and second connection nodes, the inductor including a pattern conductor formed on at least one dielectric layer, wherein the second signal line includes a first capacitor formed of two pattern conductors in such a manner that at least one dielectric layer is sandwiched therebetween and no magnetic layers are sandwiched therebetween, wherein the second signal line includes a first via conductor extending through one magnetic layer, wherein the third signal line includes a second capacitor formed of two pattern conductors in such a manner that at least one dielectric layer is sandwiched therebetween and no magnetic layers are sandwiched therebetween, and wherein the third signal line includes a second via conductor extending through one magnetic layer, and the first and second via conductors extend respectively from first and second pattern conductors of the respective second and third signal lines through the same magnetic layer to the respective first and second connection nodes on the first signal line.

5. The high-frequency device according to claim 4, wherein the magnetic layers comprise a magnetic material having a relative permeability of 100-300.

6. The high-frequency device according to claim 4, wherein the magnetic layers comprise an insulating ceramic comprising a ferrite.

7. The high-frequency device according to claim 4, wherein the dielectric layer comprises a nonmagnetic body having a relative permeability of 1.

8. The high-frequency device according to claim 4, wherein the high-frequency device is an attenuator.

9. The high-frequency device according to claim 8, wherein the high-frequency device is a low pass filter.

10. The high-frequency device according to claim 8, wherein the high-frequency device is a high pass filter.

11. The high-frequency device according to claim 8, wherein the high-frequency device is a band pass filter.

12. A directional coupler comprising:

first to fourth ports;

a first transmission line provided between the first and second ports;

a second transmission line provided between the third and fourth ports and electromagnetically coupled to the first transmission line;

a first attenuator provided between the third port and the second transmission line; and a second attenuator provided between the fourth port and the second transmission line, wherein the first and second attenuators are high-frequency devices, each high-frequency device comprising:

a substrate including a plurality of layers that are stacked on top of one another and include at least one dielectric layer and at least one magnetic layer;

first and second terminals;

at least one pattern conductor formed on one of the plurality of layers; and at least one via conductor extending through one of the plurality of layers, wherein the at least one pattern conductor and the at least one via conductor connect the first and second terminals to each other and form a signal line that transmits a predetermined high-frequency signal, wherein a first portion of the signal line includes at least one of: a via conductor extending through one magnetic layer and a pattern conductor sandwiched between two magnetic layers, wherein the first portion has a predetermined resistance to the high-frequency signal, wherein a second portion of the signal line includes at least one of a capacitor formed of two pattern electrodes in such a manner that at least one dielectric layer is sandwiched therebetween and no magnetic layers are sandwiched therebetween, and an inductor including a pattern conductor formed on at least one dielectric layer, and wherein the high-frequency device has predetermined impedances to the high-frequency signal at the first and second terminals.

\* \* \* \* \*